US006835576B2

(12) United States Patent
Matsuzaki et al.

(10) Patent No.: US 6,835,576 B2
(45) Date of Patent: Dec. 28, 2004

(54) MAGNETIC THIN FILM, A MAGNETIC COMPONENT THAT USES THIS MAGNETIC THIN FILM, MANUFACTURING METHODS FOR THE SAME, AND A POWER CONVERSION DEVICE

(75) Inventors: Kazuo Matsuzaki, Nagano (JP); Taku Furuta, Nagano (JP); Kazumi Takagiwa, Nagano (JP); Zenchi Hayashi, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 460 days.

(21) Appl. No.: 09/846,773

(22) Filed: May 1, 2001

(65) Prior Publication Data

US 2002/0090755 A1 Jul. 11, 2002

(30) Foreign Application Priority Data

May 2, 2000 (JP) ........................................ 2000-133744

(51) Int. Cl.[7] .......................... H01L 21/00; H01L 21/44
(52) U.S. Cl. ............................................ 438/3; 438/108
(58) Field of Search ...................... 438/3, 108; 346/74.2

(56) References Cited

U.S. PATENT DOCUMENTS 3,359,521 A * 12/1967 Dong et al. ................. 338/20

FOREIGN PATENT DOCUMENTS

| JP | 09-97718 | 4/1997 |
| JP | 09-330817 | 12/1997 |

* cited by examiner

*Primary Examiner*—Alexander Ghyka
(74) *Attorney, Agent, or Firm*—Darby & Darby

(57) ABSTRACT

On top of a silicon substrate, a polyimide film with a thickness of 10 $\mu$m is formed. On top of this, a magnetic thin film that is a polyimide film containing Fe fine particles and that has a thickness of 20 $\mu$m is formed. On top of this magnetic thin film, a patterned Ti/Au film and a Ti/Au connection conductor are formed. On top of this, a polyimide film with a thickness of 10 $\mu$m, and a Cu coil with a height 35 $\mu$m, width 90 $\mu$m, space 25 $\mu$m, and a polyimide layer that fills the spaces in the Cu coil are formed. On top of this, via a polyimide film with a thickness of 10 $\mu$m, a magnetic thin film that is a polyimide film containing Fe particles and that has a thickness of 20 $\mu$m is formed. This thin film inductor has a small alternating current resistance. The present invention provides a magnetic thin film that is well suited for mass production, can be manufactured easily, can be made into a thick film, has soft magnetic qualities, and is inexpensive. The present invention also provides a magnetic component that uses this magnetic thin film, manufacturing methods for these, and a power conversion device.

7 Claims, 19 Drawing Sheets magnetic particle diverse resin

MAGNETIC THIN FILM, A MAGNETIC COMPONENT THAT USES THIS MAGNETIC THIN FILM, MANUFACTURING METHODS FOR THE SAME, AND A POWER CONVERSION DEVICE

BACKGROUND OF THE INVENTION

The present invention relates to a magnetic thin film that can act as a magnetic core for a magnetic component such as a reactor, transformer, and magnetic head and the like. The present invention also relates to a magnetic component in which this magnetic thin film is formed on top of a semiconductor substrate. The present invention also relates to their manufacturing methods. The present invention also relates to a power conversion device.

In the prior art, the magnetic thin film that is the magnetic core of magnetic components such as reactors, transformers, and magnetic heads, and the like is generally manufactured by methods such as sintering, rolling, plating, and sputtering of magnetic materials.

Depending on the usage of the magnetic component, different magnetic qualities are needed. As a general classification, there are hard magnetic qualities and soft magnetic qualities. In hard magnetic qualities, the B-H quality has an angular hysterisis and has a high coercive force. A magnetic component having these hard magnetic qualities include magnetic recording medium and the like. For soft magnetic qualities, the B-H quality has a small coercive force. Magnetic components having this soft magnetic quality include power source components such as inductors and transformers which need to have low magnetic loss. For the magnetic qualities of these magnetic components used in power source components, they must have a high magnetic permeability and must have low overcurrent loss caused by the magnetic lines of force inside the magnetic body. As a result, for the magnetic materials that form the magnetic components used in power source components, magnetic qualities of a high magnetic permeability as well as a high electric resistance are desired.

For the magnetic qualities of magnetic components used in power source components, a coercive force (Hc) of 40 mA/m or less, a saturation magnetic flux density (Bs) of 1 T or greater, a magnetic permeability (mu) on the order of several thousand (MHz), and an electrical resistance (rho) of $10^{-6}$/ohm m or greater have been sought. Magnetic components formed from Co type amorphous magnetic thin films formed by sputtering and the like have been implemented.

Referring to FIG. 14, there is shown a structural diagram of a thin film inductor formed on top of a silicon substrate by a sputtering method. Referring to FIG. 14(a), there is a plan view, and referring to FIG. 14(b), there is a cross-section cut along line A—A of FIG. 14(a). This thin film inductor has a thickness of 60 micrometers. It is constructed by sandwiching a planar spiral coil of copper (a Cu coil 104) between a magnetic thin film 103 and a magnetic thin film 106. Magnetic thin film 103 and magnetic thin film 106 are Co amorphous and are formed by sputtering. Referring to the figure, a two-turn coil is shown, but in practice, coils of several turns to several tens of turns are used. Furthermore, referring to the figure, there are a silicon substrate 101 on which an IC or switching element is formed, a polyimide film 102, magnetic thin film 103 of CoHfraPd, a polyimide film 105, magnetic thin film 106 of CoHfTaPd. A connection conductor 107 connects an end part of the central part of Cu coil 104 with the switching element formed on silicon substrate 101. Connection conductor 107 is formed at the same time as when Cu coil 104 is formed.

Referring to FIG. 15, the process for manufacturing the magnetic thin film that is formed by the sputter method is shown. Referring to FIGS. 15(a) to 15(d), there are shown cross sections of the manufacturing process in the process sequence. This is the process for manufacturing the thin film inductor of FIG. 11.

A silicon substrate 81 has a built-in semiconductor element, such as IC or a switching element. After coating and baking a non-photosensitive polyimide 82 (thickness 5 $\mu$m) onto silicon substrate 81, a CoHfTaPd film 83 (thickness 9 $\mu$m) is formed by a sputter method (FIG. 15(a)). Next, a non-photosensitive polyimide 84 (thickness 5 $\mu$m) is again coated and baked. Ti/Au(=0.5/0.1 $\mu$m) is formed by a sputter method, and patterning is conducted, and this becomes a plated electrode layer 85 (FIG. 15(b)). At this time, in order to have an electrical connection with the switching element formed on silicon substrate 81, a connection conductor 90 is formed at the same time as the formation of plated electrode layer 85. Next, a photosensitive polyimide film 86 is coated and baked, and patterning is conducted, and a plating mask (thickness 30 micrometers) is formed, and a Cu coil 87 is formed by plating (FIG. 15(c)). Afterwards, a non-photosensitive polyimide 88 (thickness 5 micrometers) is coated and baked. A magnetic thin film 89 of CoHfraPd film (thickness 9 micrometers) is formed by sputter method, and the inductor is completed (FIG. 15(d)). Referring to Table 1, the qualities of an inductor created in this manner is shown.

TABLE 1

Qualities of a thin film inductor of the prior art (4 mm square, 16 turns)

| Operating conditions | Frequency 3 MHz, driving current 0.35A |
|---|---|
| Inductance value L ($\mu$H) | 0.95 |
| Direct current resistance Rdc (ohm) | 0.8 |
| Alternating current resistance Rac (ohm) | 5.38 |

In this table, the larger the inductance value L and the smaller the direct current resistance Rdc and the alternating current resistance Rac, the better the quality of the inductor.

For the manufacturing method for the magnetic thin film, when the aforementioned sintering or rolling is used, high temperature treatment of around 1000° C. is required. As a result, it is difficult to form a magnetic thin film on top of a semiconductor substrate which has a built-in IC (integrated circuit) and the like. Furthermore, when using plating, although manufacture by normal temperature treatment is possible, the control of the film thickness of the magnetic thin film is difficult. As a result, it is difficult to obtain a good magnetic quality. Furthermore, with the sputter method as described above, this is the method that is most generally used. However, the manufacture process is complex, and mass production is difficult. Therefore, the manufacture cost of magnetic components using this magnetic thin film is high. Furthermore, because the speed of growth is slow with the sputter method, making a thick film is difficult.

Stated more concretely, when forming a Co type amorphous magnetic thin film by sputtering, the speed of accumulation is slow (~2 $\mu$m/h). When mass production is considered, 9 $\mu$m is the limit for its film thickness. Currently, the magnetic thick film is implemented at this thickness. Even if mass production is not considered, if the thickness is made any greater, there can be cracking and loss due to membrane stress.

In one example of the prior art for the formation of the magnetic film by sputter method, a magnetic metal (Fe, Co, FePt, and the like) and an oxide with a large oxide heat of formation ($Al_2O_3$ and the like) are simultaneously sputter deposited. The magnetic thin film has a structure comprising particle masses of magnetic metal granules and insulating non-metals that surround these granules (H. Fujimori: Scripta metallurgica et materialia, 33, 1625 (1995), S. Ohnuma, et al: J. Appl. Phys. 79, 5130 (1996), S. Kobayashi et al: Nihon OuyouJ Jiki Gakkai-shi 20, 469 (1996), S. Olmuma et al: J. Appl. Phys., 85, 4574 (1999), and the like).

This magnetic thin film is called a metal-non-metal granular film. Compared to the usual magnetic thin film, it has a large electrical resistance. In addition, it is know to show excellent soft magnetic qualities in the high frequency region. Here, metal-non-metal granular films refer to films in which magnetic metal granules are dispersed in a resin and the like. The magnetic metal granules are metal particles (magnetic particles of Fe and the like) covered by a non-metal film (an insulating film such as oxide film and the like). Metal-non-metal granular films can also refer to films in which these magnetic metal granules are aggregated.

However, with magnetic thin films formed in this manner, because a sputter method is used, the manufacturing costs are high, and making a thick film is difficult.

Furthermore, in general in the prior art, a magnetic core of a transformer is manufactured by sintering, rolling, plating, sputtering, and the like of magnetic materials. With sintering or rolling, with high temperature treatment of around 1000° C., abulky magnetic core is formed. This type is the standard. Transformers are necessary as an insulated switching power source component. In recent years, there has been demand for smaller, thinner, and lighter components. In responding to this demand, this bulky transformer of the prior art has been a large bottleneck. Recently, instead of these bulky transformers, thin film transformers in which a thin film coil is sandwiched between magnetic thin films have been proposed. Referring to FIG. 16, there is a plan view (FIG. 16(a)) of a thin film transformer of thickness 100 $\mu$m that is created on top of a silicon substrate. Referring to FIG. 16b, there is a cross-section along section A-A'. A primary and a secondary planar spiral coil of copper (thickness 30 $\mu$m, width 90 $\mu$m, spacing 5 $\mu$m) are sandwiched by Co amorphous magnetic thin films (thickness 9 $\mu$m) that are formed by a sputter method (in the figure, for simplicity, a two turn coil is shown, but in reality, a sixteen turn coil is used). Referring to FIG. 17, a flow diagram of the prior art is shown. A silicon substrate 171 has a built-in semiconductor element. After coating and baking a non-photosensitive polyimide 172 (thickness 5 $\mu$m) onto silicon substrate 171, a CoHtTaPd film 173 (thickness 9 $\mu$m is formed by sputter method (FIG. 17(a)). Next, a non-photosensitive polyimide 174 (thickness 5 $\mu$m) is coated and baked again, and a Ti/Au film 175 (=0.5/0.1 $\mu$m) is formed by sputter method. Patterning is conducted and a plating mask (photosensitive polyimide) 176 (thickness 30 $\mu$m) is formed. Cu plating is conducted, and a primary coil 177 is formed (FIG. 17(c)). Afterwards, the process in FIG. 17(b) is repeated, and a non-photosensitive polyimide 178 (thickness 5 $\mu$m), a plated electrode layer 179 of Ti/Au(= 0.5/0.1 $\mu$m) are formed (FIG. 17d). Furthermore, the process in FIG. 17c is repeated. After coating and baking a plating mask (photosensitive polyimide) 180 (thickness 5 $\mu$m), non-photosensitive polyimide film 182 is formed. Similarly, a secondary coil 181 is provided, and a CoHfTaPd film 183 (thickness 9 $\mu$m) is formed by sputter method, and the transformer is completed (FIG. 17(e)). The electrical connection part with the coil is omitted, but a contact part is formed. For convenience, the primary and the secondary coils are shown having equal turn numbers, however, if the input output voltage ratio is changed, they can be formed in the same manner with different turn numbers. With this structure of the prior art, the distance between magnetic thin films become large (in the figure, it is 75 $\mu$m), and the leakage flux becomes large. The interlinkage flux between the primary and secondary coils is reduced, and as a result, the magnetic bond between them is weakened, and the output from the primary side is not efficiently transmitted to the secondary side. As a result, with the construction of the prior art, in general, the transformer has a low conversion efficiency.

Furthermore, in the prior art, for the lead wires, enamel wires that are covered with enamel are known. With this type of covered wire, in order to maintain electrical insulation even if there is contact between conductors, the wires are covered with an insulating material. However, in recent years, in conjunction with the miniaturization and high density mounting of electrical components, there have been problems with electromagnetic interference. Because the coated wires of the prior are only for electrical insulation, the mutual interference from the magnetic fields created by current flowing in the lead wires cannot be avoided. Therefore, if the lead wires are covered with a film that can act as an electromagnetic shield, this problem can be avoided.

Furthermore, a power conversion device such as a DC-DC converter and the like has a power source module. In this power source module, individual components of switching element, rectifying element, condenser, control IC and magnetic induction components of coil and transformer and the like are formed as a hybrid on top of a printed substrate of ceramic or plastic and the like. The miniaturization of hybrid power source modules has advanced due to technology such as MCM (multi-chip module), and the like. However, the miniaturization of magnetic induction components such as coil and transformer and the like is difficult. Because these take up a large volume, the miniaturization of the power source module is limited. In recent years, with the use of semiconductor technology, there have been reports of examples of thin micro-magnetic elements (coil, transformer) mounted on top of a semiconductor substrate. For example, in Japanese Laid-Open Patent Application Number 8-149626, a planar magnetic inductor component is disclosed. However, using thin film technology, the process for forming a planar magnetic induction component on top of a substrate with a built-in semiconductor integrated circuit is complex and lengthy. Furthermore, when the planar magnetic induction component is formed by a thin film process, the magnetic thin film and the insulating filler material shrink due to heat treatment. With this stress, there can be warping of the substrate, and processing becomes difficult.

The above, and other objects, features and advantages of the present invention will become apparent from the following description read in conjunction with the accompanying drawings, in which like reference numerals designate the same elements.

OBJECT AND SUMMARY OF THE INVENTION

It is an object of the present invention is to provide a magnetic thin film that is well suited for mass production, can be manufactured easily, can be made into a thick film, has soft magnetic qualities, and is inexpensive. The present invention also provides a magnetic component that uses this magnetic thin film, manufacturing methods for these, and a power conversion device.

In order to achieve the above objective, the following are implemented.

1) A magnetic thin film, comprising:
   a resin in which magnetic fine particles are dispersed.
2) A magnetic thin film as described in Item 1), wherein:
   the magnetic fine particles contain at least one metal element selected from a group consisting of Fe, Ni, Co, Mn, and Cr.
3) A magnetic thin film as described in Item 1) or 2), wherein:
   the resin is a non-photosensitive resin or a photosensitive resin.
4) A magnetic thin film as described in one of Items 1) through 3), wherein:
   the resin is an organic magnetic polymer.
5) A magnetic thin film as described in Item 4), wherein:
   the organic magnetic polymer is a cross conjugated polycarbene or a conjugated polymer that has a main chain of polyacetylene and polydiacetylene.
6) A magnetic thin film, wherein:
   the thin film is constructed from magnetic fine particles, and the fine particles are aggregated so that the fine particles are in contact with each other.
7) A magnetic thin film as described in one of Items 1) through 6), wherein:
   the fine particle comprises a magnetic particle and an insulating film that surrounds the perimeter of the magnetic particle.
8) A manufacturing method for a magnetic thin film, comprising:
   a process for dispersing magnetic fine particles in a medium;
   a process for coating the medium on top of an insulating film;
   a process for heat treating and solidifying the medium.
9) A manufacturing method for a magnetic thin film as described in Item 8), wherein:
   the medium is a non-photosensitive resin solution or a photosensitive resin solution.
10) A manufacturing method for a magnetic thin film, comprising:
    a process for dispersing magnetic fine particles in a medium;
    a process for coating the medium on top of an insulating film;
    a process for heat treating, evaporating, and removing the medium.
11) A manufacturing method for a magnetic thin film as described in Item 10), wherein:
    the medium is toluene.
12) A magnetic component, comprising:
    a first magnetic thin film and a second magnetic thin film being magnetic thin films described in one of Items 1) through 7);
    the first magnetic thin film being formed on top of a semiconductor substrate via an insulating film;
    a thin film conductor being formed in a spiral shape on top of the first magnetic thin film;
    a second resin that fills spaces in the spiral thin film conductor;
    the second magnetic thin film being formed on top of the thin film conductor and the second resin.
13) A magnetic component as described in Item 12), wherein:
    the second resin is a magnetic thin film as described in one of Items 1) through 5).
14) A magnetic component, comprising:
    a third magnetic thin film and a fourth magnetic thin film being magnetic thin films described in Item 6);
    the third magnetic thin film being formed on top of a semiconductor substrate via an insulating film;
    a thin film conductor being formed in a spiral shape on top of the third magnetic thin film;
    the third magnetic thin film being formed in spaces in the spiral thin film conductor;
    the fourth magnetic thin film being formed on top of the thin film conductor and the third magnetic thin film.
15) A manufacturing method for a magnetic component, comprising:
    a first magnetic thin film and a second magnetic thin film being magnetic thin films described in one of Items 1) through 5);
    a process for forming the first magnetic thin film on top of a semiconductor substrate via an insulating film;
    a process for forming a thin film conductor in a spiral shape on top of the first magnetic thin film;
    a process for filling a second resin in spaces in the spiral thin film conductor;
    a process for forming the second magnetic thin film on top of the thin film conductor and the second resin.
16) A manufacturing method for a magnetic component as described in Item 15), wherein:
    the second resin is a magnetic thin film described in one of Items 1) through 5).
17) A manufacturing method for a magnetic component, comprising:
    a third magnetic thin film and a fourth magnetic thin film being magnetic thin films described in Item 6);
    a process for forming the third magnetic thin film on top of a semiconductor substrate via an insulating film;
    a process for forming a spiral-shaped thin film conductor on top of the third magnetic thin film;
    a process for forming the third magnetic thin film in spaces in the spiral-shaped thin film conductor;
    a process for forming the fourth magnetic thin film on top of the thin film conductor and the third thin film.
18) A magnetic component, comprising:
    a first magnetic thin film and a second magnetic thin film being magnetic thin films described in one of Items 1) through 5);
    the first magnetic thin film being formed on top of an insulating substrate via an insulating film;
    a thin film conductor being formed in a spiral shape on top of the first magnetic thin film;
    a second resin filling spaces in the spiral-shaped thin film conductor;
    the second magnetic thin film being formed on top of the thin film conductor and the second resin.
19) A magnetic component as described in Item 18), wherein:
    the second resin is a magnetic thin film as described in one of Items 1) through 5).

20) A magnetic component, comprising:
- a third magnetic thin film and a fourth magnetic thin film being magnetic thin films described in Item 6);
- the third magnetic thin film being formed on top of an insulating substrate via an insulating film;
- a thin film conductor being formed in a spiral shape on top of the third magnetic thin film;
- the third magnetic thin film being formed in spaces in the spiral-shaped thin film conductor;
- the fourth magnetic thin film being formed on top of the thin film conductor and the third magnetic thin film.

21) A magnetic component as described in one of Items 12) through 14), wherein:
- the magnetic component is a transformer.

22) A magnetic component as described in one of Items 12) through 14), wherein:
- the magnetic component is a power conversion device.

23) A lead wire, wherein:
- the lead wire is covered with a magnetic thin film described in one of Items 1) through 7).

24) A magnetic component, comprising:
- a lead wire as described in Item 23) being used as a coil.

25) A current sensor, comprising:
- a magnetic sensor being provided on a lead wire described in Item 23).

26) A magnetic component as described in one of Items 12) through 14), comprising:
- an insulating film being between the first magnetic thin film and the thin film conductor and the second resin and between the thin film conductor and the second resin and the second magnetic thin film.

27) A magnetic component as described in one of Items 12) through 14), wherein:
- the thin film conductor and the second resin is formed as two layers via an insulating film.

28) A power conversion device, comprising:
- a magnetic component, comprising:
  - a magnetic thin film as described in one of Items 1) through 7) being formed on top of a semiconductor integrated circuit substrate via an insulating film;
  - a thin film conductor being formed in a spiral shape on top of the magnetic thin film;
  - a second resin being filled in spaces in the spiral-shaped thin film conductor;
- the magnetic component being mounted on top of a wiring substrate;
- the magnetic component being resin sealed by a resin in which magnetic fine particles are dispersed.

29) A power conversion device, comprising:
- a magnetic component, comprising:
  - a magnetic thin film as described in one of Items 1) through 7) being formed on top of a semiconductor integrated circuit substrate via an insulating film;
  - a thin film conductor being formed in a spiral shape on top of the magnetic film;
  - a second resin being filled in spaces in the spiral-shaped thin film conductor;
- the magnetic component being mounted onto a lead frame;
- a lead terminal being connected to the magnetic component by a metal thin wire;
- the lead terminal and the lead frame and the magnetic component are resin sealed by a resin in which magnetic fine particles are dispersed.

30) A power conversion device as described in Item 28) or 29), wherein:
- the thin film conductor and the second resin are formed in two layers via an insulating film.

31) A power conversion device as described in Item 28) or 29), wherein:
- an insulating film is formed on top of the thin film conductor and the second resin.

As described above, fine particles of magnetic material are dispersed in a medium of resin or a solvent. This medium is coated, dried, and sintered. With this simple method, a magnetic thin film that is suited for mass production, is easy to manufacture, can be made into a thick film, and has soft magnetic qualities can be manufactured inexpensively. Furthermore, magnetic components using this magnetic thin film and power conversion devices can also be manufactured inexpensively.

BRIEF DESCRIPTION OF THE DRAWINGS

FIGS. 4(a)–4(c) show cross-sectional diagrams of the manufacturing process in the process sequence.

FIG. 6 is a sixth embodiment of the present invention and shows a manufacturing method for the thin film inductor of the fifth embodiment.

FIG. 8 is an eighth embodiment of the present invention and shows a manufacturing method for the thin film inductor of the seventh embodiment.

FIG. 14 is a structural drawing of a thin film inductor that is formed on top of a silicon substrate by the sputter method.

FIG. 15 is a manufacturing process for the magnetic thin film created by the sputter method.

DESCRIPTION OF THE PREFERRED EMBODIMENTS

Figure 12:
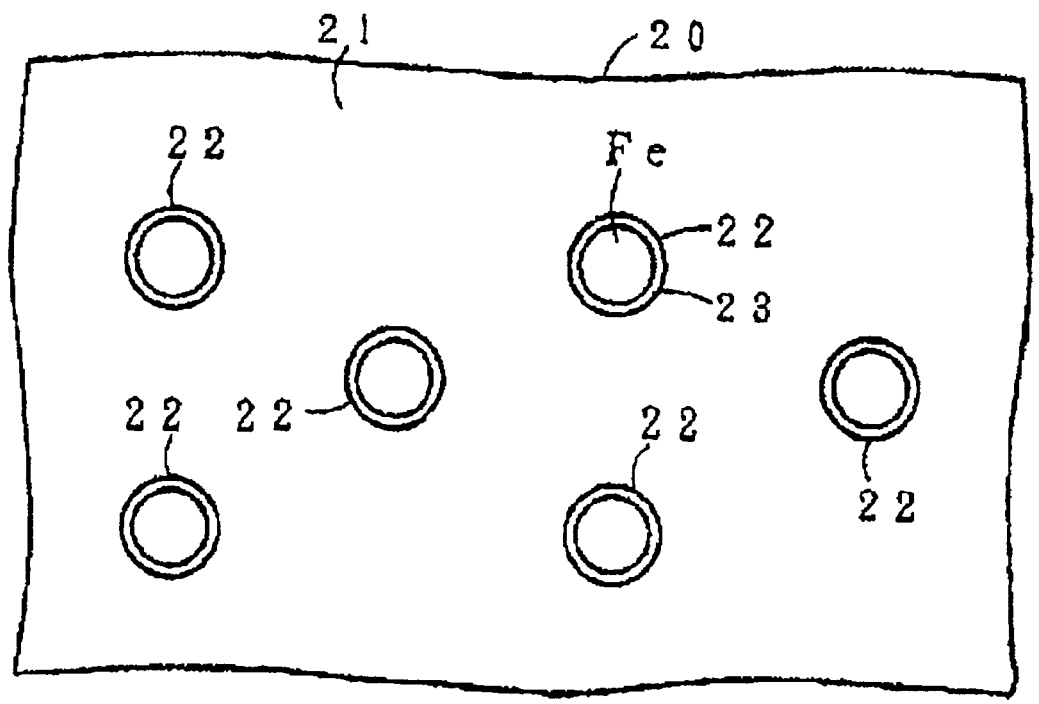
FIG. 12 is a first schematic drawing of the magnetic thin film of the present invention.

Referring to FIG. 12, there is a first schematic drawing of a magnetic thin film of the present invention. A magnetic thin film 20 is of a magnetic material such as Fe and the like. For example, magnetic fine particles (magnetic particles 22) coated with an insulating film 23 are dispersed in a medium such as a resin 21. This film is formed by using a coating method in which this medium is coated, dried, and sintered on top of a semiconductor substrate or on top of an insulated substrate. Therefore, this film is an aggregate of cellular structures in which magnetic particles 22 are surrounded by resin 21. Furthermore, the magnetic qualities of magnetic thin film 20 are approximately determined by the physical constants of magnetic particles 22 which are dispersed in resin 21 or aggregated. Its electrical resistance is approximately determined by the electrical resistance of insulating film 23 and resin 21 that surround magnetic particles 22. As a result, the electrical resistance of magnetic thin film 20 is the sum of the resistances of insulating film 23 and resin 21 and is a high resistance.

The aforementioned cells containing magnetic particles 22 can easily align in one direction or can scatter with a small magnetic field. As a result, a magnetic thin film 20 with a small coercive force is obtained. Furthermore, for the magnetic flux density, the basic value is provided by the magnetic material. The magnetic flux density can be increased in approximate proportion with the density of the aforementioned cells.

As described above, by not using a sputter method and using a coating method instead, making a thick film for magnetic thin film 20 can be achieved easily. At the same time, magnetic thin film 20 can be formed with a flat surface irrespective of the roughness of the undercoat.

Furthermore, magnetic thin film 20 is a metal-non-metal granular film as described above. Magnetic particles 22 are surrounded by insulation, and as a result, compared with the standard magnetic thin films that are formed entirely with magnetic material, they have a large electrical resistance and exhibit excellent soft magnetic qualities in high frequency regions.

Magnetic thin film 20 will be described further. Magnetic material powder of diameter approximately several 10's nm is dispersed in a resin of polyimide and the like. This is rotation coated and baked (sintered). The solvent component is removed, and this becomes a film. Each one of the magnetic powder of several 10's nm is surrounded by resin 21. These are dispersed or aggregated to form a film.

Figure 13:
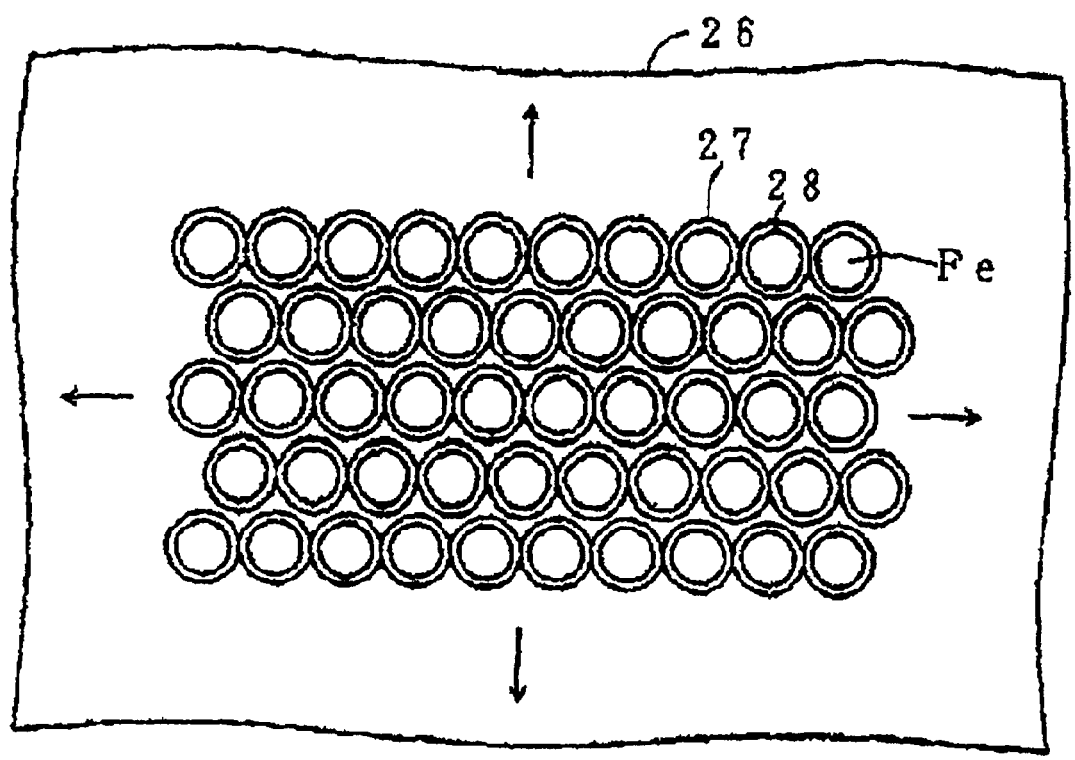
FIG. 13 is a second schematic drawing of the magnetic thin film of the present invention.
Figure 14A:
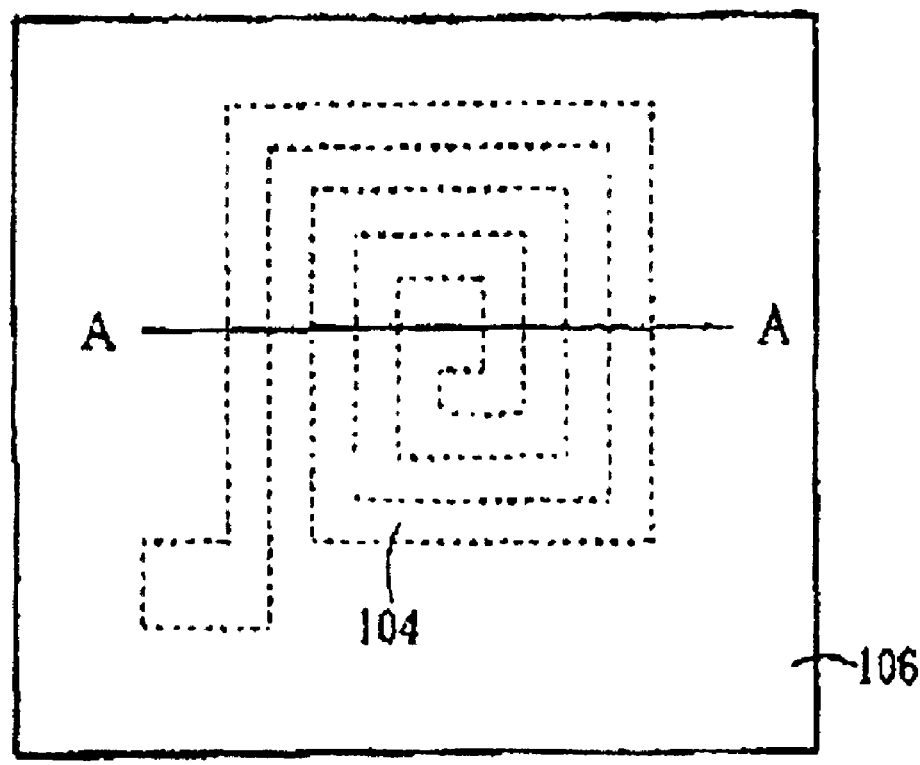
FIG. 14(a) is a plan view.
Figure 14B:
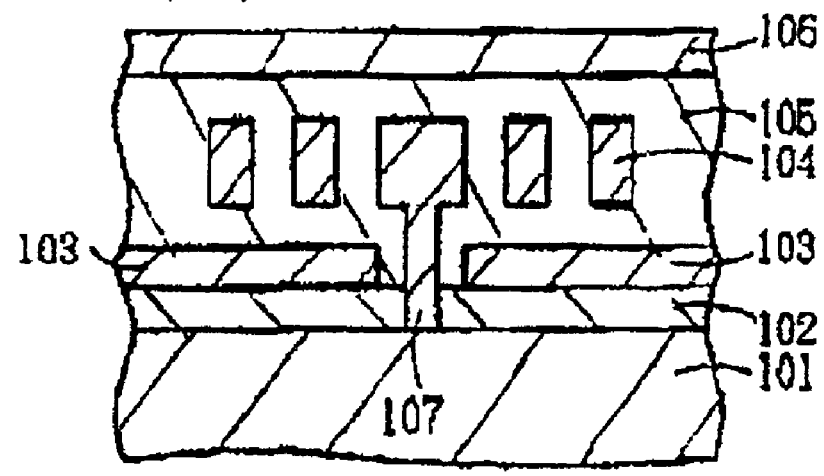
FIG. 14(b) is a cross-section drawing cut along line A—A of FIG. 14(a).
Figure 15A:
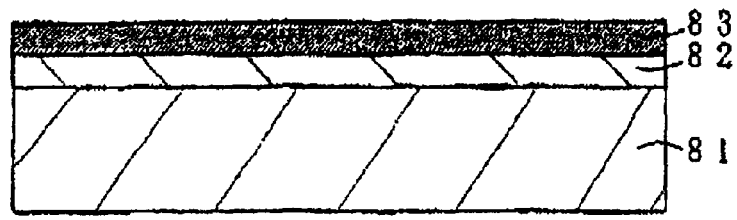
FIGS. 15(a) to 15(d) are cross-sections of the manufacturing process in the process sequence.
Figure 15B:
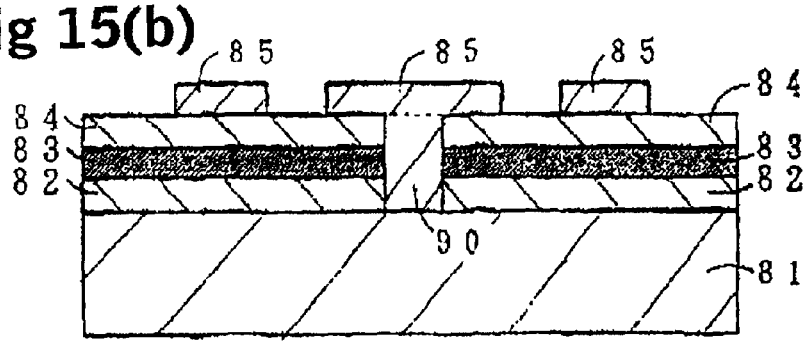
Figure 15C:
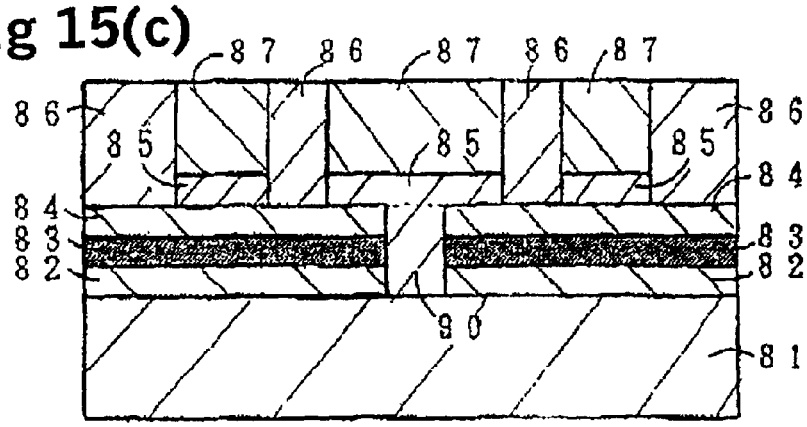
Figure 15D:
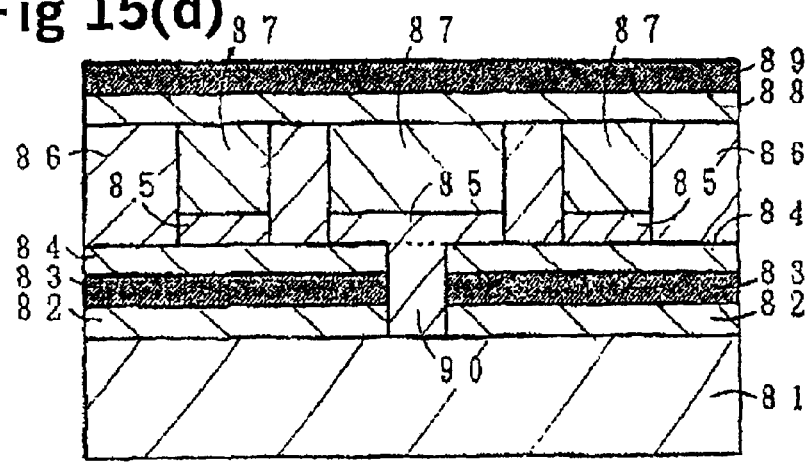
Figure 16A:
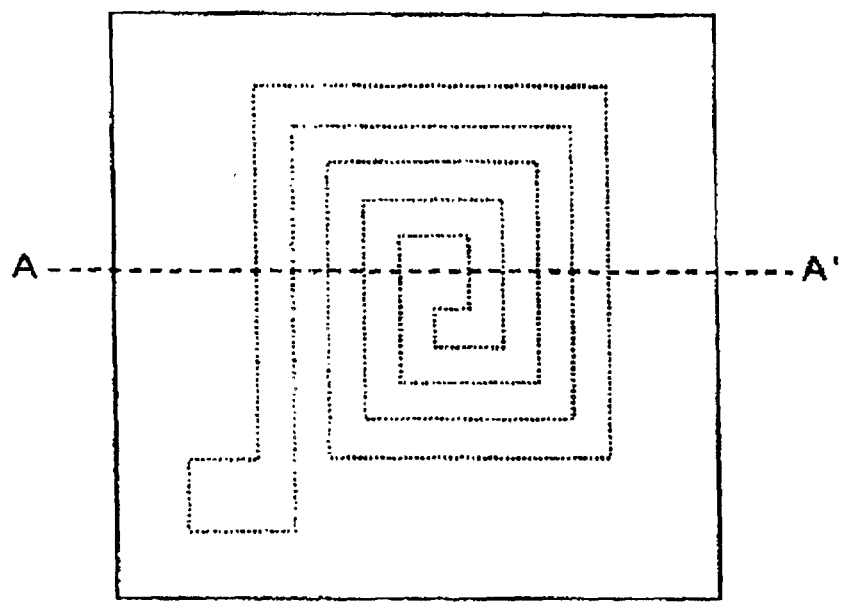
FIG. 16(a) is a plan view of a thin film transformer with a thickness of 100 $\mu$m created on top of a silicon substrate.
Figure 16B:
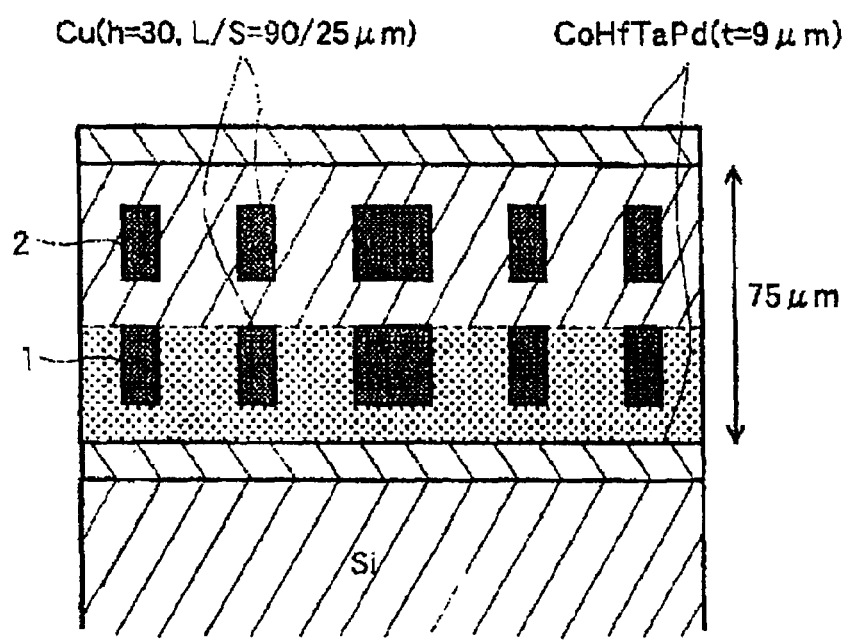
FIG. 16(b) is a cross-sectional drawing of section A-A'.
Figure 17A:
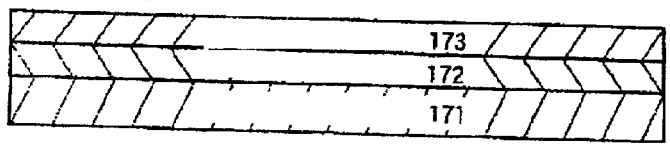
FIG. 17 is a manufacture process flow diagram for a transformer of the prior art.
Figure 17B:
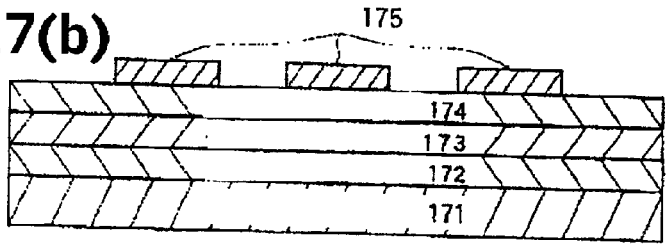
Figure 17C:
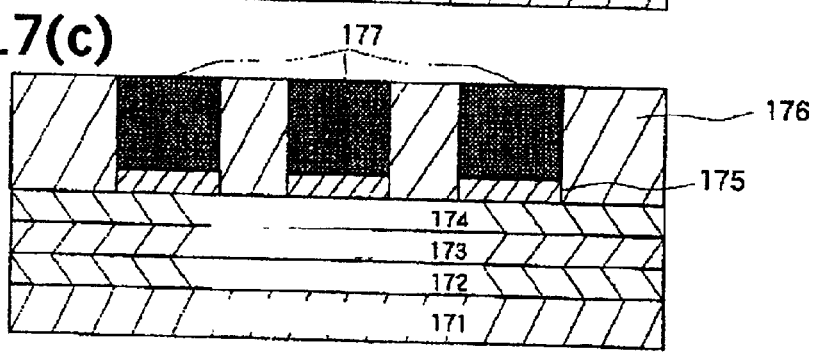
Figure 17D:
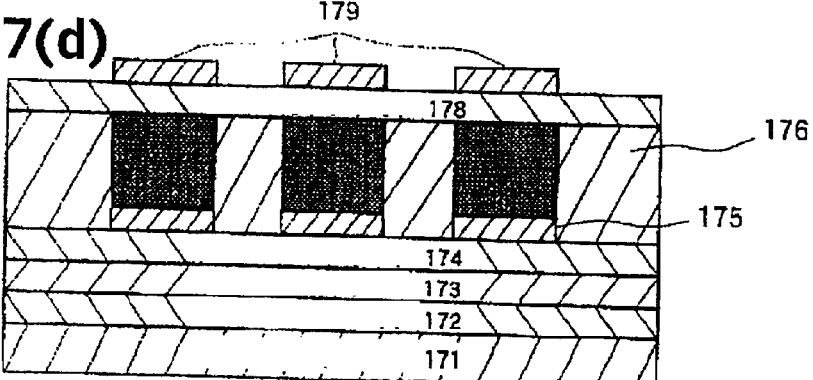
Figure 17E:
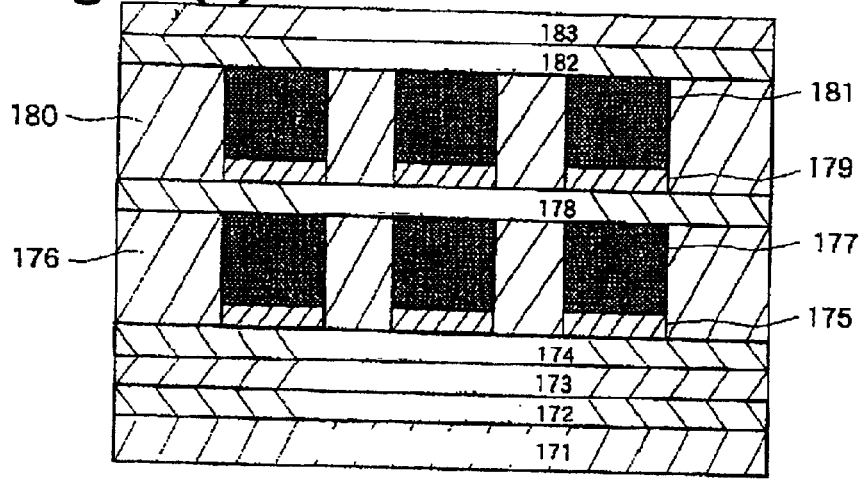

The above described magnetic material powder does not always have to be dispersed in a resin with high viscosity such as polyimide. The magnetic material powder can be coated in a condition in which it is dispersed in a solvent. This solvent can be evaporated, and ultimately, the magnetic material powder is an aggregated condition (refer to FIG. 13). Even with this condition, a satisfactory performance is achieved. Furthermore, when magnetic material powder is coated with an oxide film, for example, even when it contacts a conductor that is placed near it, an electrical short does not result, and thus, this is more desirable. Referring to the figure, there is a magnetic thin film 26, a magnetic particle 27, and an oxide film 28. Magnetic particle 27 is a Fe fine particle covered with oxide film 28.

By dispersing magnetic powder in a resin or a solvent and coating onto a substrate, a magnetic powder is formed on top of the substrate. Depending on the form of the substrate, the magnetic powder can be a layer or film exhibiting a uniform distribution, or it can be filled into grooves in the spaces of a thin film coil, for example.

Next, this magnetic thin film and its manufacturing method and a magnetic component that uses this magnetic thin film and its manufacturing method will be described more concretely.

Figure 1:
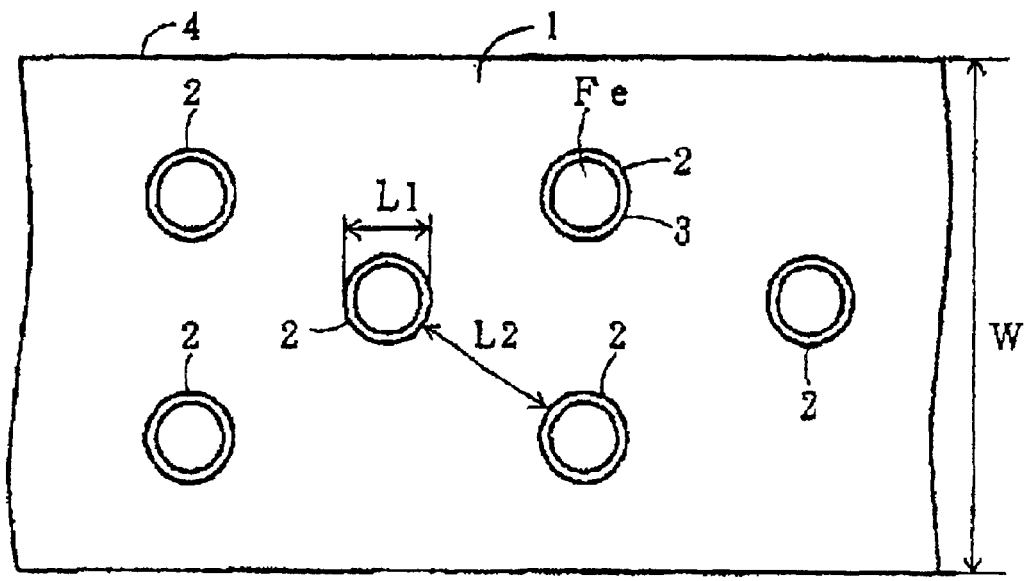
FIG. 1 is a cross-section of the principal parts of a magnetic thin film of a first embodiment of the present invention.

Referring to FIG. 1, there is a cross-section of the principal part of the magnetic thin film of the first embodiment of the present invention. A magnetic particle 2 of size 20 nm is formed by surrounding Fe fine particles with a thin oxide film 3 of a thickness of several nm's. A magnetic thin film 4 has a structure in which magnetic particles 2 are scattered in a polyimide film 1 at approximately 100 nm intervals. Stated differently, magnetic thin film 4 has a structure wherein entities (the aforementioned cells) in which magnetic particles of 20 nm is surrounded by polyimide of approximately 100 nm thickness are placed approximately uniformly in polyimide. Furthermore, in terms of manufacturing the magnetic component, the practicable range for thickness W of magnetic thin film 4 is from several $\mu$m to several 10's of $\mu$m. If the thickness is less than several $\mu$m, it is difficult to achieve a magnetic flux density that is necessary for a magnetic component. As a magnetic component, adequate magnetic qualities can be achieved if the thickness W of the magnetic thin film is several 10's of nm.

For a diameter L1 of the aforementioned magnetic particle, around 10 nm to 30 nm is a practicable size. If diameter L1 is less than 10 nm, the density of cells becomes small, and the magnetic flux density becomes too small. Furthermore, if diameter L1 exceeds 30 nm, the cells can not be scattered uniformly, and it is difficult to achieve a uniform magnetic quality over the entire thin film.

Furthermore, an interval L2 between magnetic particles of 0 nm to several 100 nm is preferred. With an interval L2 of 0 nm, the magnetic particles are in contact with each other. When interval L2 exceeds several 100 nm, the density of cells becomes small, and the magnetic flux density becomes too small.

Figure 2:
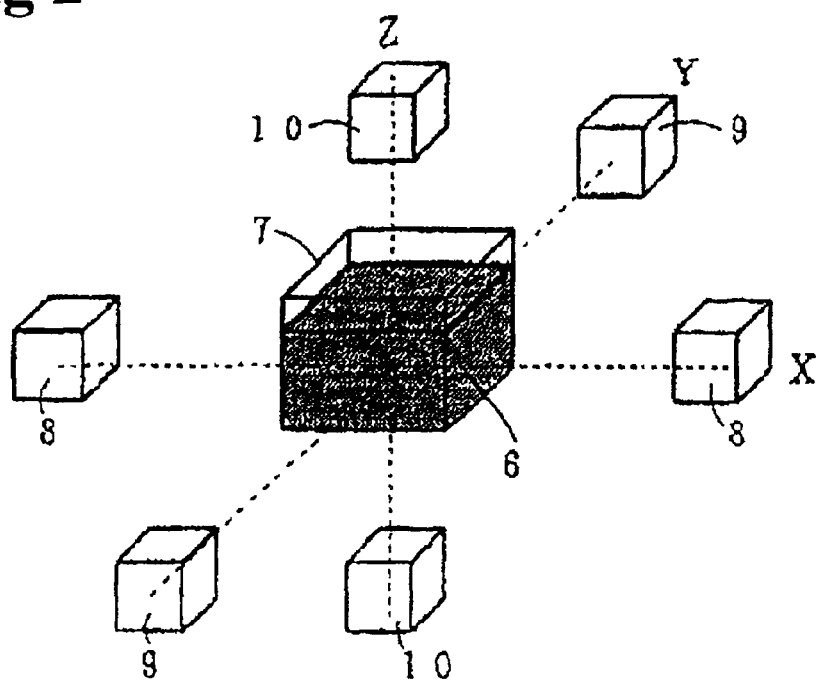
FIG. 2 is a second embodiment of the present invention and is the manufacturing method for the first embodiment of the magnetic thin film.

Referring to FIG. 2, a second embodiment of the present invention is shown, and it is a manufacture method for the magnetic thin film of the first embodiment. The magnetic particle that is used has an average particle size of 20 nm and has the surface of Fe covered with an oxide film.

The volume ratio of the oxide film portion is approximately around 5% of the total volume of the particle. 100 g of these magnetic particles is mixed with 150 g of polyimide and 200 g of toluene. In order to have a uniform dispersal, this is mixed with a mixing device. The mixing device is described below. A sample container 7 holding the solution of magnetic particles, polyimide, and solvent is set at the center of three pairs of electromagnetic coils 8, electromagnetic coils 9, and electromagnetic coils 10. Electromagnetic coils 8, 9, 10 are placed in three directions of X, Y, Z axis. Each pair of electromagnetic coils 8, electromagnetic coils 9, and electromagnetic coils 10 is sequentially operated at a period of 3 kHz with a 1 kHz delay for each. As a result, the magnetic particles dispersed in the medium of polyimide and solvent periodically shift sequentially in the X, Y, Z direction along the magnetic field (48 kA/m) created by electromagnetic coils 8, 9, 10. This operation is continued for approximately 3 hours. A dispersion solution 6 (medium in which magnetic particles are dispersed) is completed in sample container 7. Dispersion solution 6 can be coated to a thickness of 20 μm on top of a 6 inch phi silicon substrate at a rotation frequency of 500 rpm, for example. This is baked for 1 hour at 300° C. Thereupon, a magnetic thin film is formed. The magnetic thin film has a structure in which 20 nm magnetic particles surrounded by approximately 100 nm thick polyimide are approximately uniformly arranged. Furthermore, if the medium is only toluene, it has a structure (FIG. 13) wherein the 20 nm magnetic particles are in contact via the oxide films.

The manufacturing method for the dispersion solution shown here is only one example. The aforementioned X, Y, Z directions can be divided further.

In this manner, magnetic thin film 4 can be easily formed on top of the substrate. In other words, magnetic thin film 4 is well suited for mass production and can be made into a thick film. Because it is a simple process, it can be formed at a low cost. Furthermore, because magnetic thin film 4 is a metal-non-metal granular film, it has soft magnetic qualities.

Next, an embodiment of a thin film inductor as one example of a magnetic component using magnetic thin film 4 is described. In addition, an embodiment for its manufacturing method is also described.

Figure 3:
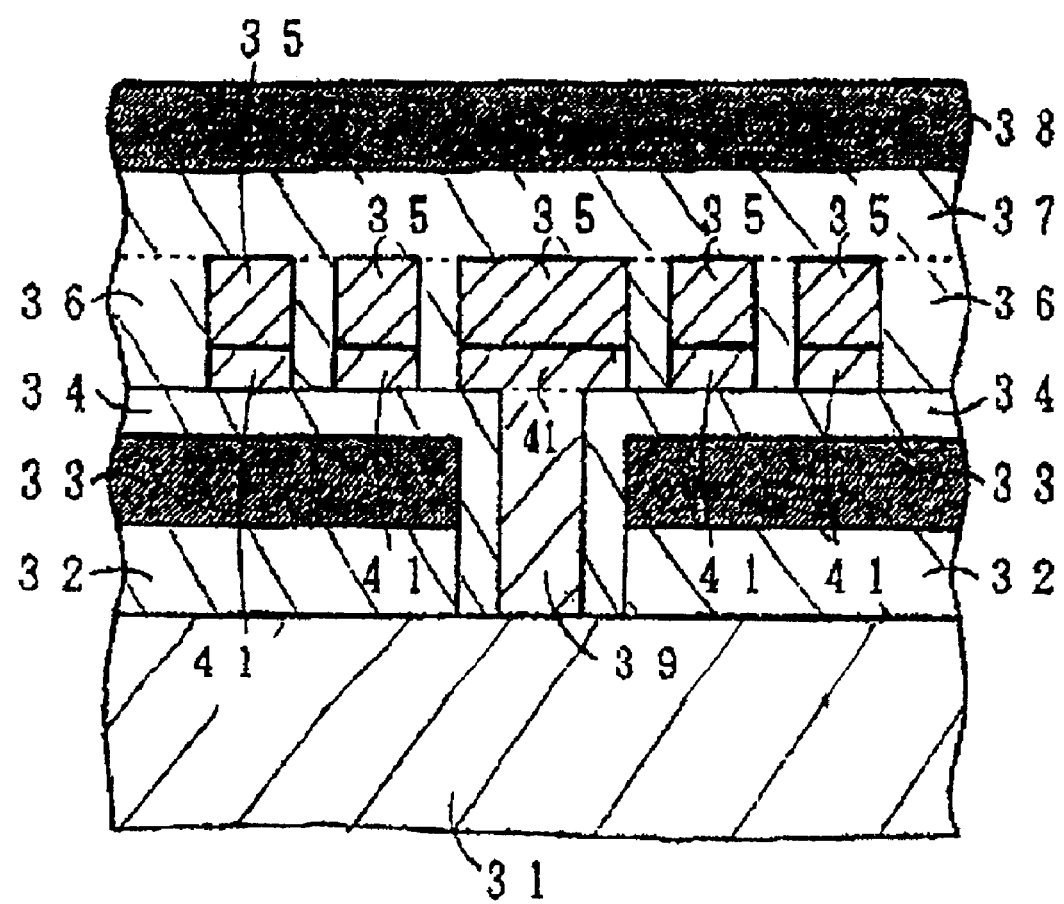
FIG. 3 is a third embodiment of the present invention and is a cross-section of a thin film inductor using the magnetic thin film of the first embodiment.

Referring to FIG. 3, a third embodiment of the present invention is shown. Referring to FIG. 3, there is shown a cross-section of a thin film inductor that uses the magnetic thin film of the first embodiment. This embodiment is a thin film inductor in which on top of a semiconductor substrate (silicon substrate) on which IC or a power switching element is formed, the thin film inductor connects with the power switching element and the like.

On top of a silicon substrate 31, a 10 μm thick polyimide film 32 is formed. On top of this, a magnetic thin film 33 with a thickness of 20 μm is formed. Magnetic thin film 33 is a polyimide film containing Fe fine particles as shown in FIG. 1. On top of magnetic thin film 33, a polyimide film 34 with a thickness of 10 μm is formed. On top of polyimide film 34, a patterned Ti/Au film 41 and a Ti/Au connection conductor 39 are formed. On top of this, a Cu coil 35 with a height 35 μm, width 90 μm, and space 25 μm, and a polyimide layer 36 that fills the space are formed. On top of this, via a 10 μm thick polyimide film 37, a magnetic thin film 38 with a thickness of 20 μm is formed. Magnetic thin film 38 is a polyimide film containing Fe fine particles as shown in FIG. 1. Magnetic thin film 33 and magnetic thin film 38 of this structure are magnetic thin films of FIG. 12 or FIG. 13. This thin film inductor is a 4 mm square, and Cu coil 35 is a square spiral with a turn number of 16. Referring to Table 2, the thin film inductor qualities when this method of the present invention is used is shown.

TABLE 2

Qualities of the thin film inductor of Embodiment 1
(4 mm square, 16 turn)

| Operating conditions | Frequency 3 MHz, driving current 0.35A |
|---|---|
| Inductance value L (microH) | 0.95 |
| Direct current resistance Rdc (ohm) | 0.8 |
| Alternating current resistance Rac (ohm) | 3.38 |

Compared to the qualities of the Co amorphous magnetic film of the prior art (Table 1), the electrical resistance is high, and over-current does not flow as easily. With the alternating current resistance, the resistance is reduced by the amount resulting from over-current. As a result, the alternating current resistance is smaller.

Figure 4:
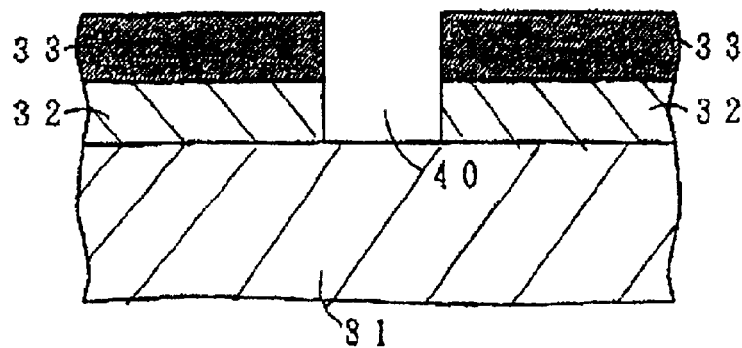
FIG. 4 is a fourth embodiment of the present invention and shows a manufacturing method for the thin film inductor of the third embodiment.
Figure 4:
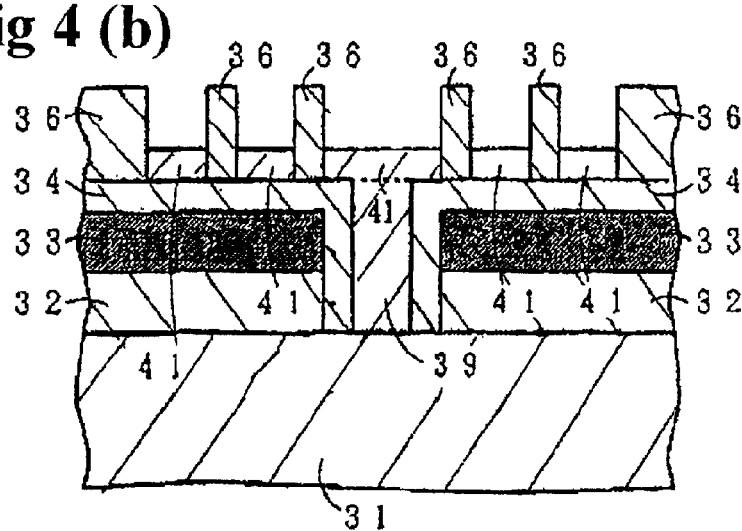
Figure 4:
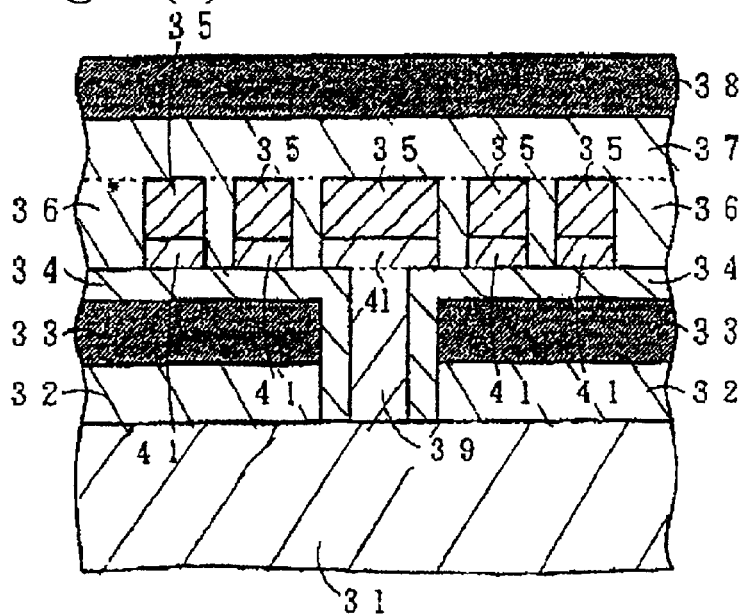

Referring to FIG. 4, this is the fourth embodiment of the present invention and shows a manufacturing method for a thin film inductor of the third embodiment. Referring to FIG. 4(a) to FIG. 4(c), cross-sections of the manufacturing process in the process sequence is shown.

Polyimide film 32 with a thickness 10 μm is formed on top of silicon substrate 31. On top of this, magnetic layer 33 with a thickness 20 μm is formed. Afterwards, an opening 40 that reaches silicon substrate 31 is formed (FIG. 4(a)). Next, on top of this, polyimide film 34 of thickness of 10 μm is formed, and an opening that is continuous with opening 40 is formed. Afterwards, an undercoat metal (Ti/Au film 41) for forming Cu coil 35 by plating and a connection conductor 39 for connecting silicon substrate 31 with Cu coil 35 are sputter deposited. Patterning is conducted, and polyimide 36 that acts as a plating mask is formed (FIG. 4(b)). Afterwards, with polyimide 36 as a mask, Cu coil 35 with a height of 35 μm, width 90 μm, space 25 μm is formed. Polyimide layer 36 is a mask that fills the spaces in Cu coil 35. On top of Cu coil 35 and polyimide layer 36, polyimide film 37 with a thickness of 10 μm is formed. On top of this, magnetic layer 38 with a thickness of 20 μm is formed, and the thin film inductor is completed (FIG. 4(c)).

Figure 5:
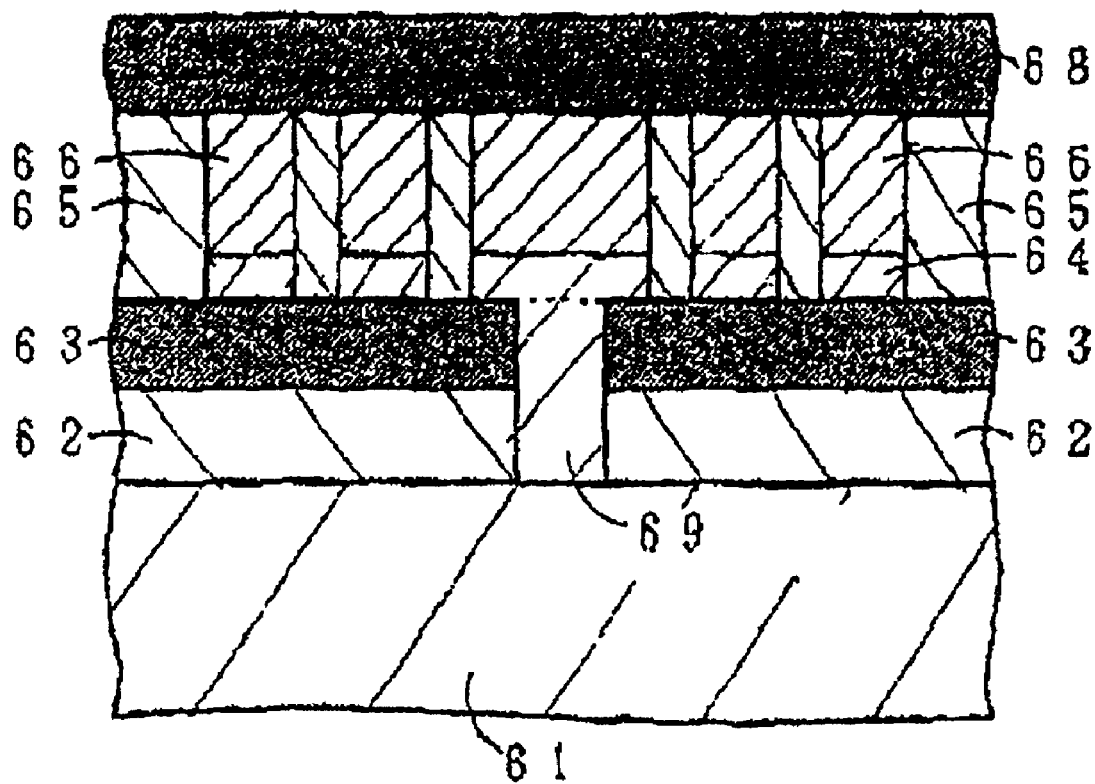
FIG. 5 is a cross-section of the principal parts of a thin film inductor of a fifth embodiment of the present invention.

Referring to FIG. 5, a cross-section of the principal parts of a thin film inductor of a fifth embodiment of the present invention is shown. The difference between this embodiment and the third embodiment is that a plating mask 65 is a photosensitive polyimide film in which magnetic particles are dispersed as in FIG. 12. Ultimately, the structure is one where a Cu coil 66 is surrounded by this magnetic medium (a photosensitive polyimide film in which magnetic particles are dispersed) (in the third embodiment, the magnetic medium is only placed above and below Cu coil 35. There is leakage of magnetic flux generated on the side surfaces). There is very little leakage flux, and a thin film inductor having qualities of a higher inductance value and a lower alternating current loss can be achieved.

A polyimide film 62 is formed on top of a silicon substrate 61 in which a semiconductor element is built in. On top of polyimide film 62, a magnetic thin film 63 with a thickness of 20 $\mu$m is formed. In magnetic thin film 63, Fe particles having a particle size of 20 nm and having its surface covered by oxide are dispersed in a non-photosensitive polyimide. On top of magnetic thin film 63, a plating electrode of a Ti/Au film 64 and a Ti/Au connection conductor 69 are formed. Instead of the usual photosensitive polyimide film, a magnetic thin film in which magnetic particles are dispersed is patterned. Using this as a plating mask 65, Cu coil 66 with a thickness of 30 $\mu$m and a turn number of 16 is formed by plating. On top of this, a magnetic thin film 68 with a thickness of 20$\mu$m is formed. In magnetic thin film 68, Fe particles having a particle size of 20 nm and having its surface covered by an oxide are dispersed in a non-photosensitive polyimide. With the thin film inductor obtained in this manner, the exterior of Cu coil 66 is entirely covered with a resin in which magnetic particles are dispersed (magnetic thin film ). As a result, the magnetic flux that is created by the current flowing through Cu coil 66 is tightly bound. Therefore, compared to the prior art and compared to the first embodiment, because the inductance value is large and the leakage flux is small, the alternating current resistance is small. This is shown in the results in Table 3.

TABLE 3

Qualities of the thin film inductor of Embodiment 2
(4 mm square, 16 turn)

| Operating conditions | Frequency 3 MHz, driving current 0.35A |
|---|---|
| Inductance value L (microH) | 1.15 |
| Direct current resistance Rdc (ohm) | 0.8 |
| Alternating current resistance Rac (ohm) | 2.38 |

Figure 6A:
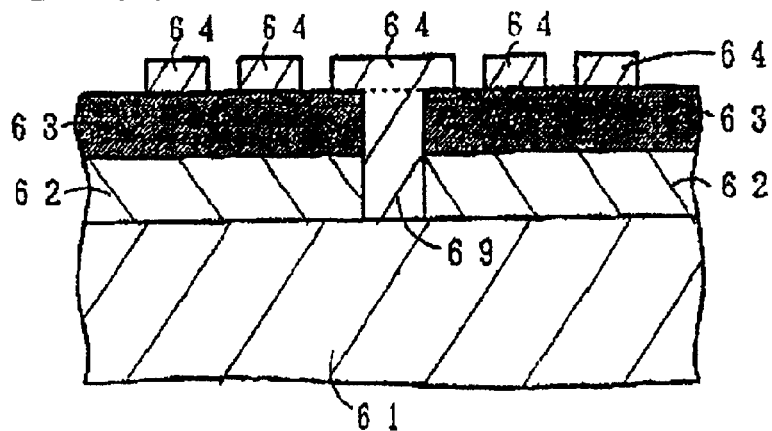
FIGS. 6(a)–6(c) show cross-sectional diagrams of the manufacturing process in the process sequence.
Figure 6B:
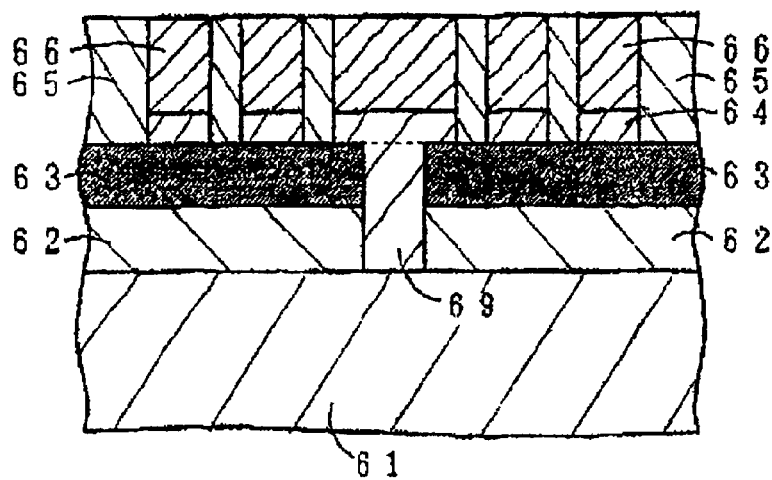
Figure 6C:
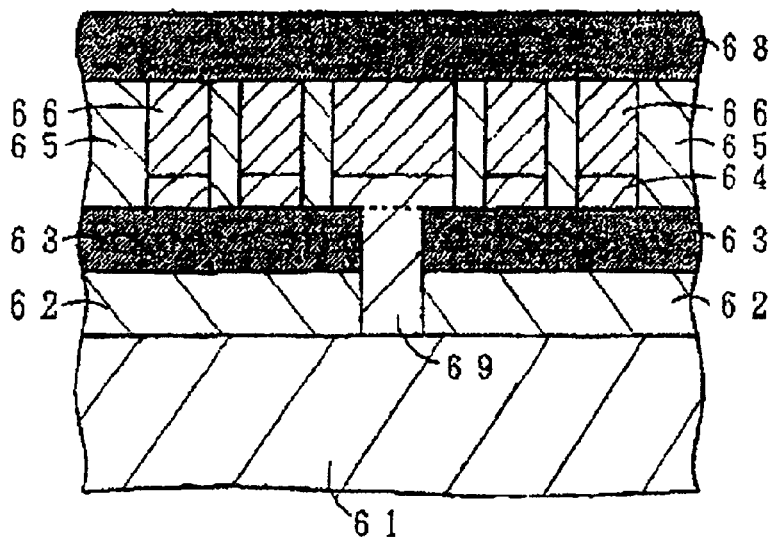

Referring to FIG. 6, this is the sixth embodiment of the present invention and shows the manufacture method for the thin film inductor of the fifth embodiment. Referring to FIGS. 6(a)–6(c), there are shown the cross-section diagrams of the manufacture process in the process sequence.

Polyimide film 62 is formed on top of silicon substrate 61 with a built-in semiconductor element. In the same manner as in the fourth embodiment, Fe particles that have their surfaces covered with an oxide and that have a particle size of 20 nm are dispersed in a non-photosensitive polyimide. This is rotation coated at a rotation frequency of 500 rpm and baked. Magnetic thin film 63 of thickness 20 $\mu$m is formed on top of polyimide film 62. On top of magnetic thin film 63, in the same manner as in the prior art, a plating electrode of Ti/Au film 64 and Ti/Au connection conductor 69 are formed (FIG. 6(a)). Next, photosensitive polyimide in which magnetic particles are dispersed is rotation coated at a rotation frequency of 200 rpm and baked. This is exposed to light and developed, and plating mask 65 with a thickness of 30 $\mu$m is formed. As with the prior art, Cu coil 66 with a thickness of 30 $\mu$m and a turn number of 16 is formed (FIG. 6(b)). Again, on top of this, non-photosensitive polyimide in which Fe particles having their surfaces covered with an oxide and having a particle size of 20 nm are dispersed is rotation coated at a rotation frequency of 500 rpm and baked. Magnetic thin film 68 of thickness 20 $\mu$m is formed, and the thin film inductor is completed (FIG. 6(c)).

Figure 7:
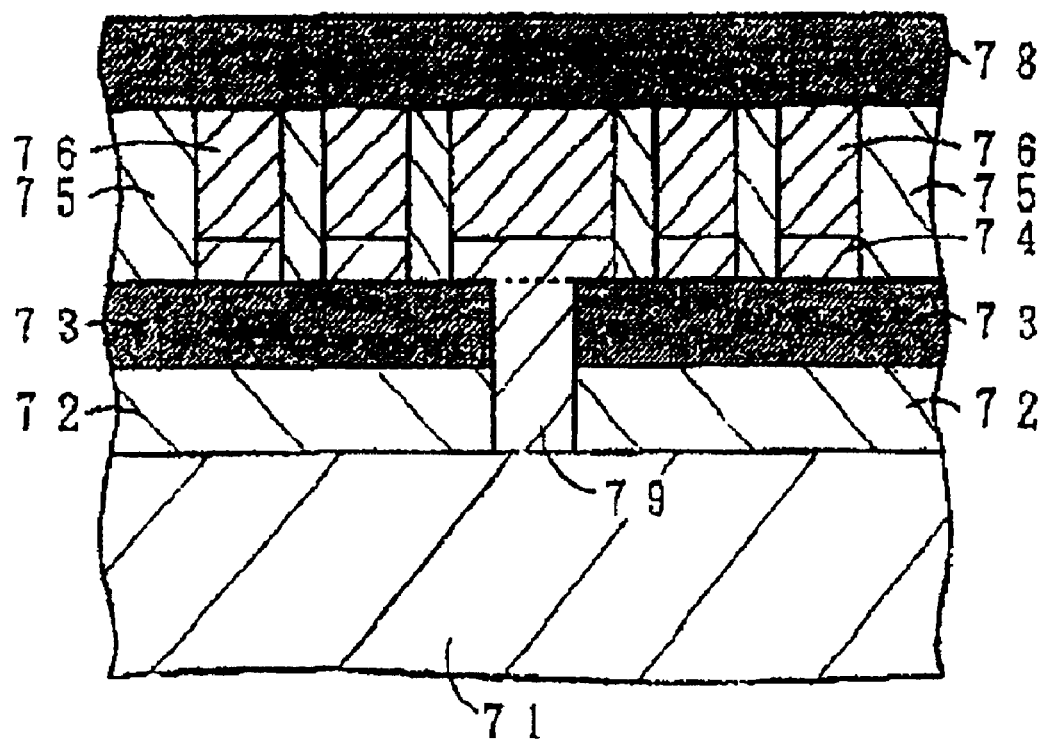
FIG. 7 is a cross-section of the principal parts of a thin film inductor of a seventh embodiment of the present invention.

Referring to FIG. 7, a cross-section diagram of the principal parts of a thin film inductor of the seventh embodiment of the present invention is shown.

A polyimide film 72 is formed on top of a silicon substrate 71 in which a semiconductor element is built in. On top of polyimide film 72, a magnetic thin film 73 with a thickness of 10 $\mu$m is formed. With magnetic thin film 73, Fe fine particles that are covered with an oxide film and that have an average particle size of 20 nm are aggregated as in FIG. 13. On top of magnetic thin film 73, a plating electrode of a Ti/Au film 74 and a connection conductor 79 which connects with silicon substrate 71 are formed. On top of this, a Cu coil 76 of thickness 30 $\mu$m and 16 turns is formed. A magnetic thin film 78 in which Fe fine particles are aggregated is formed between and above Cu coil 76, and the thin film inductor is completed. Compared with the third and fifth embodiments, the magnetic bonding is strong because there is no resin (however, because fine particles that have their surfaces covered with an oxide are aggregated, they are electrically insulated). As a result, referring to Table 4, compared to the thin film inductors of the third and fifth embodiments, a thin film inductor with a high inductance value and a small alternating current resistance is obtained.

TABLE 4

Qualities of the thin film inductor of the third embodiment
(4 mm square, 16 turn)

| Operating conditions | Frequency 3 MHz, driving current 0.35A |
|---|---|
| Inductance value L (microH) | 2.15 |
| Direct current resistance Rdc (ohm) | 0.8 |
| Alternating current resistance Rac (ohm) | 1.38 |

Figure 8A:
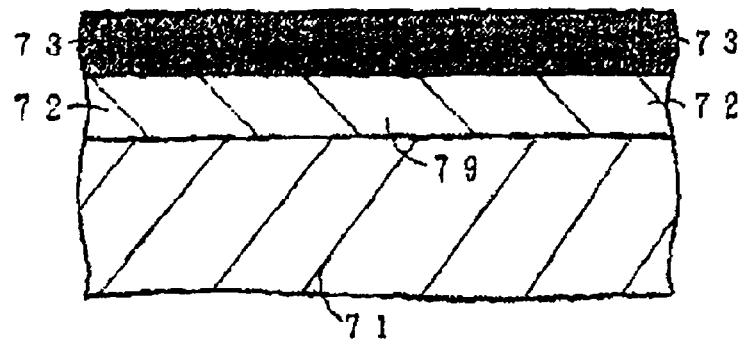
FIGS. 8(a)–8(c) show cross-sectional diagrams of the manufacturing process in the process sequence.
Figure 8B:
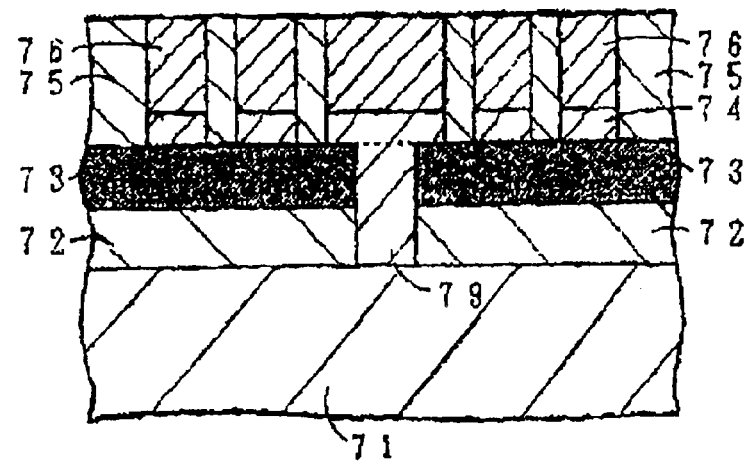
Figure 8C:
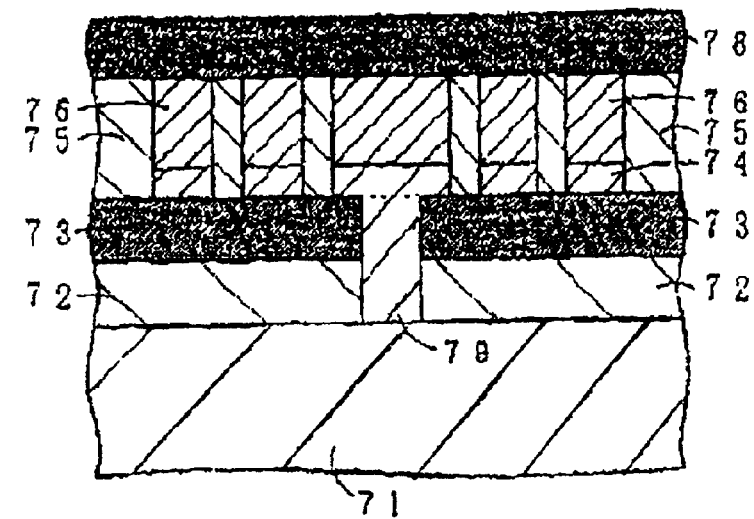

Referring to FIG. 8, this is the eighth embodiment of the present invention and shows the manufacture method for the thin film inductor of the seventh embodiment. Referring to FIGS. 8(a)–8(c), there are shown the cross-section diagrams of the manufacture process in the process sequence.

A toluene solvent containing Fe fine particles that are covered with an oxide film and have an average particle size of 20 nm is coated with a brush onto silicon substrate 71 which has a built-in semiconductor element. After eliminating the solvent by drying at 100° C. (3 minutes), magnetic thin film 73 with a thickness of 10 $\mu$m is formed by baking at 250° C. (15 minutes) (FIG. 8(a)). In magnetic thin film 73, magnetic particles are aggregated as in FIG. 13. On top of magnetic film 73, plating electrode of Ti/Au film 74 and plating mask 75 are formed. Cu plating is conducted to form Cu coil 76 with a thickness of 30 $\mu$m and 16 turns (FIG. 8(b)). Afterwards, the plating mask is bleached in an oxygen plasma and incinerated and removed (or it can be removed by a solvent). Next, in the same manner as the method at the start, toluene solvent containing Fe fine particles is coated with a brush, dried, and baked. This results in the formation of magnetic thin film 78 between the Cu coil and on top of the Cu coil (FIG. 8(c)). With magnetic thin film 78, the Fe fine particles are aggregated.

With power source components such as small and thin reactors and transformers comprising a conductor coil and a magnetic thin film, the magnetic thin film part of these power source components can be manufactured by a simple process by using the methods described above. This simple process includes coating with a resin or solvent in which magnetic fine particles are dispersed and drying and baking this. Furthermore, because the magnetic thin film that is formed can have a high electrical resistance, the reduction in manufacturing costs and the reduction in loss can be achieved simultaneously for the magnetic components such as reactors and transformers.

Figure 9:
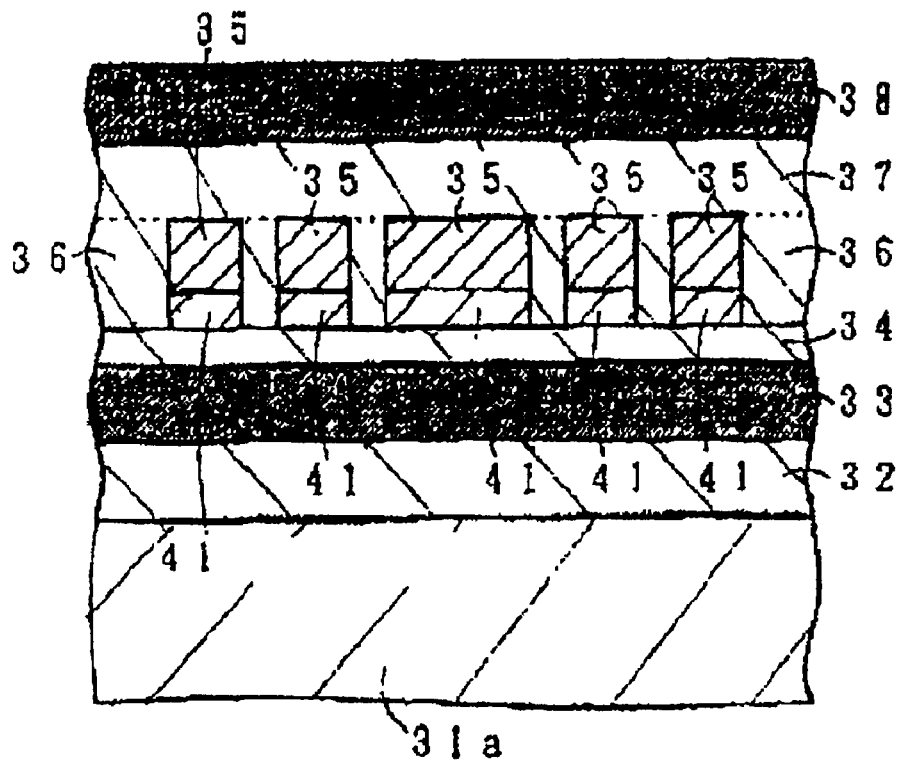
FIG. 9 is a cross-section of the principal part of a thin film inductor of a ninth embodiment of the present invention.

Referring to FIG. 9, a cross-sectional diagram of the principal parts of a thin film inductor of the ninth embodiment of the present invention is shown. The difference between this embodiment and the sixth embodiment is that the thin film inductor is formed not on top of a semiconductor substrate but on top of an insulating substrate 31a.

Figure 10:
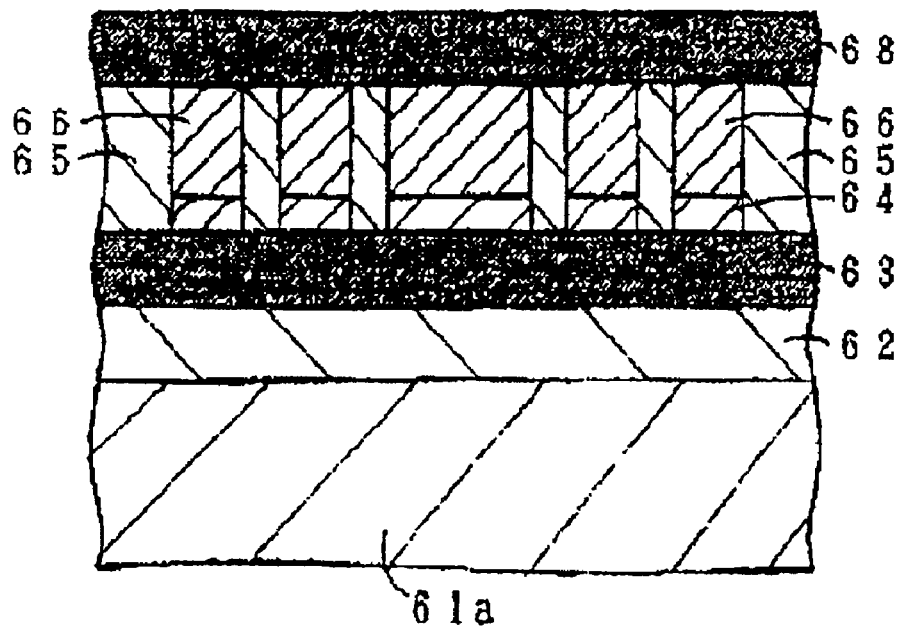
FIG. 10 is a cross-section of the principal part of a thin film inductor of a tenth embodiment of the present invention.

Referring to FIG. 10, a cross-sectional diagram of the principal parts of a thin film inductor of the tenth embodiment of the present invention is shown. The difference with the seventh embodiment is that the thin film inductor is formed not on top of a semiconductor substrate but on top of an insulating substrate 61a.

Figure 11:
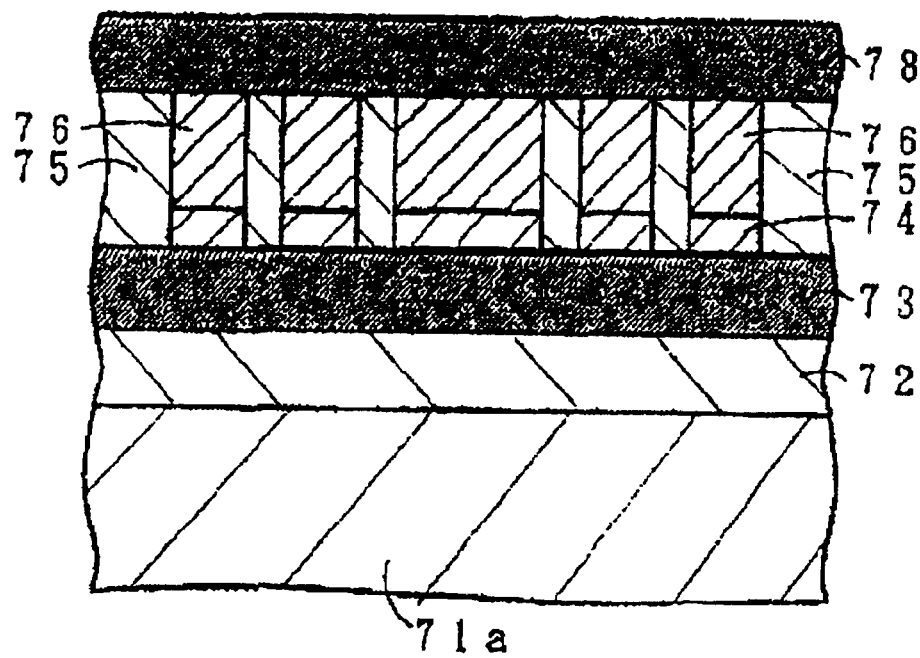
FIG. 11 is a cross-section of the principal part of a thin film inductor of an eleventh embodiment of the present invention.

Referring to FIG. 11, a cross-sectional diagram of the principal parts of a thin film inductor of the eleventh embodiment of the present invention is shown. The difference with the eighth embodiment is that the thin film inductor is formed not on top of a semiconductor substrate but on top of an insulating substrate 71a.

The qualities of the thin film inductors of these embodiments are the same as with the embodiments described previously.

Figure 18:
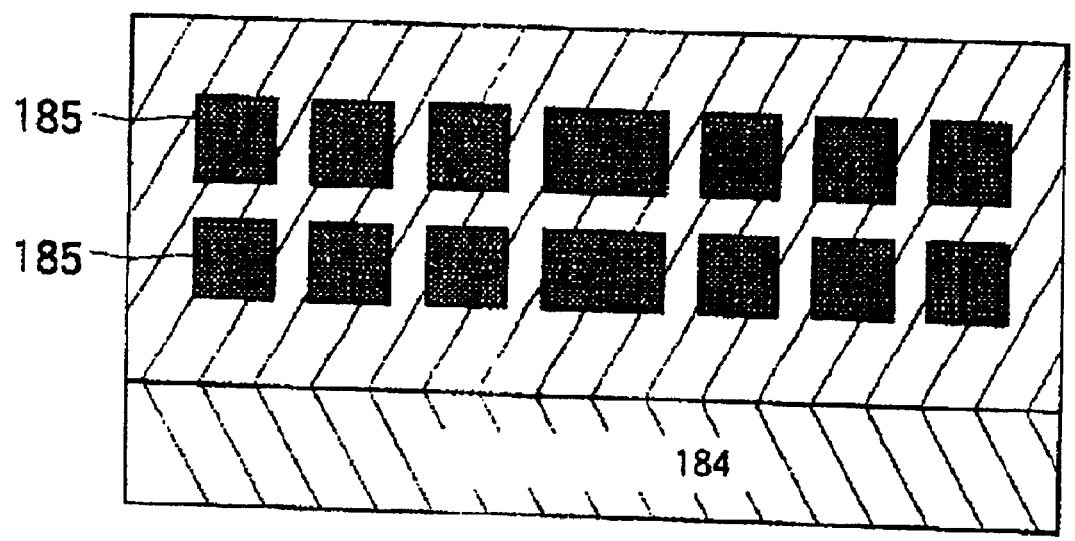
FIG. 18 is a cross-section drawing of one example of a thin film transformer of a twelfth embodiment of the present invention.
Figure 19A:
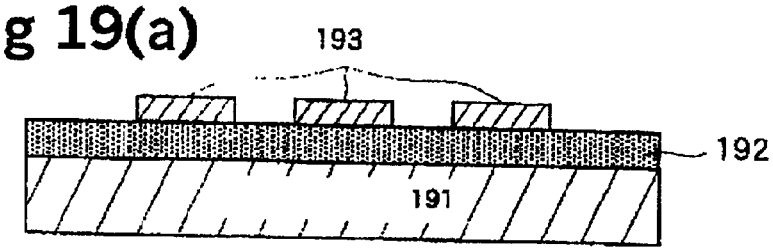
FIG. 19 is a thirteenth embodiment of the present invention and shows a manufacture process flow diagram of the thin film transformer of FIG. 18.
Figure 19B:
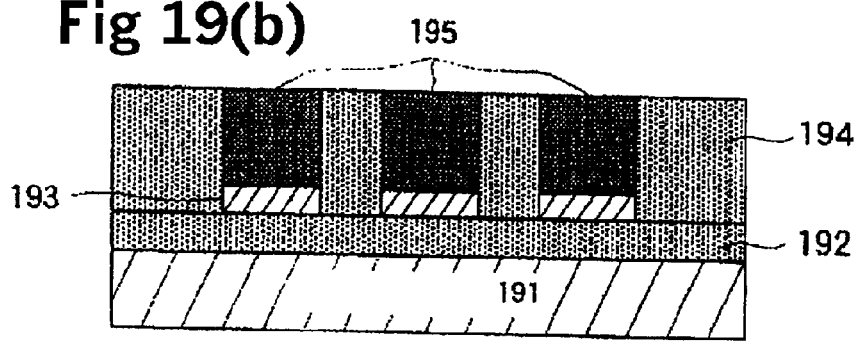
Figure 19C:
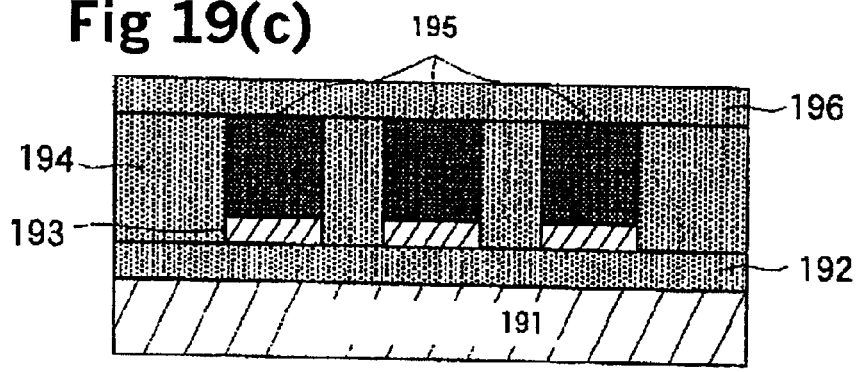
Figure 19D:
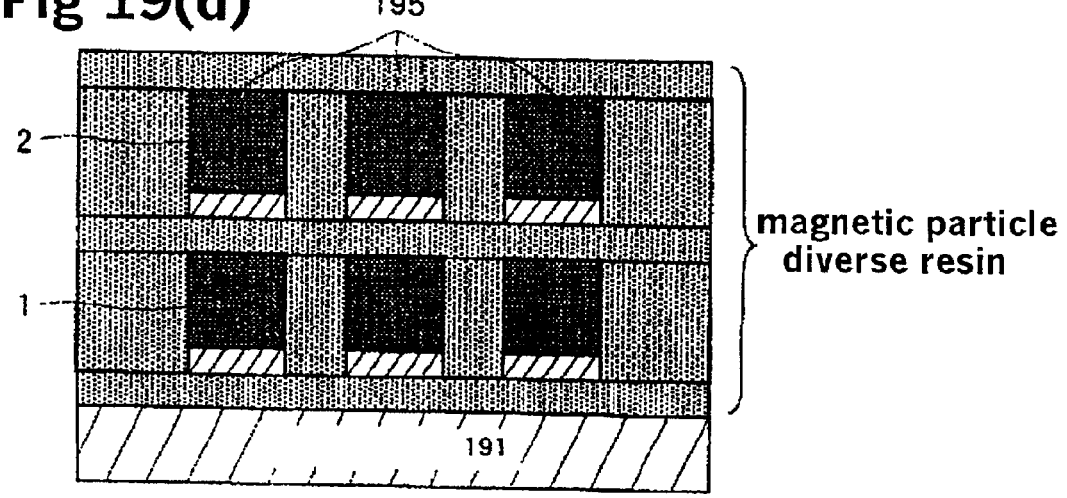

Referring to FIG. 18, there is shown a cross-sectional diagram of one example of a thin film transformer of the twelfth embodiment of the present invention. A primary Cu conductor coil 185 and a secondary Cu conductor coil 185 have a height of 31 $\mu$m, width of 90 $\mu$m, and space of 25 $\mu$m. Primary Cu conductor coil 185 and secondary Cu conductor coil 185 are formed on top of silicon substrate 184 and are embedded in a polyimide resin in which magnetic particles are mixed in. This thin film transformer is a 4 mm square, and the Cu conductor coil has a turn number of 16 and is a square spiral. The formation method for the polyimide resin, which is used in the above construction and which has magnetic particles mixed in, will be described more concretely below. For the magnetic particles, particles that have surfaces of Fe covered with an oxide film and that have an average particle size of 20 nm are used. The volume ratio of the oxide film portion is 5% or less of the total volume of the particle. The manufacturing method for these magnetic particles is the same as with the second embodiment described above.

Referring to FIG. 19, this is the thirteenth embodiment of the present invention and shows a flow diagram of the manufacturing process of the thin film transformer of FIG. 18. Ultimately, this embodiment has a structure in which the coil conductors are surrounded by the magnetic medium. The leakage magnetic flux is low, and the magnetic bonding of the primary and secondary coils is tight, and a thin film transformer with low loss is achieved. Referring to FIG. 19, the process flow will be described. Fe particles that have their surfaces covered with an oxide and that have a particle size of 20 nm are dispersed in a non-photosensitive polyimide. This is rotation coated at a rotation frequency of 500 rpm and baked on top of a silicon substrate 191 with a built-in semiconductor element. A thin film of a magnetic resin 192 with a thickness of 5 $\mu$m is formed. On top of this, in the same manner as in the prior art, a plating electrode 193 of Ti/Au is formed (FIG. 19(a)). Next, magnetic particle dispersion medium that is changed to photosensitive polyimide is rotation coated at a rotation frequency of 200 rpm and baked. This is exposed to light and developed, and a Cu plating coil 195 with a thickness of 30 $\mu$m and a turn number of 16 is formed (FIG. 19(b)). A magnetic resin 194 is in the spaces in Cu plating coil 195. Again, on top of this, non-photosensitive polyimide, in which Fe particles having their surfaces covered with an oxide and having a particle size of 20 nm are dispersed, is rotation coated at a rotation frequency of 500 rpm and baked. A magnetic thin film 196 with thickness of 5 $\mu$m is formed (FIG. 19(c)). By repeating the above process, a secondary coil that is surrounded by magnetic dispersion medium is similarly formed, and the thin film transformer is completed (FIG. 19(d)). With the transformer obtained in this manner, the exterior of the Cu coil conductors are entirely covered with resin in which magnetic particles are dispersed. As a result, the magnetic flux created by the current flowing in the primary coil conductor and the secondary coil conductor are tightly bound. Therefore, because the leakage magnetic flux is smaller compared to the prior art, the resistance loss is also small.

Figure 20:
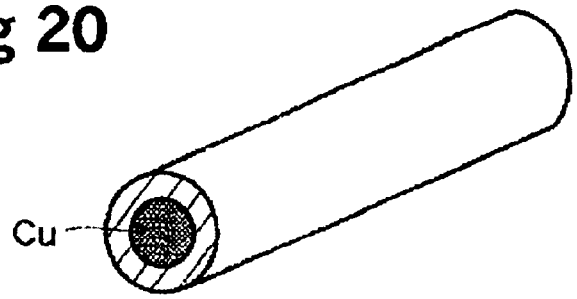
FIG. 20 is a cross-section of a lead wire which is a fourteenth embodiment of the present invention.
Figure 21:
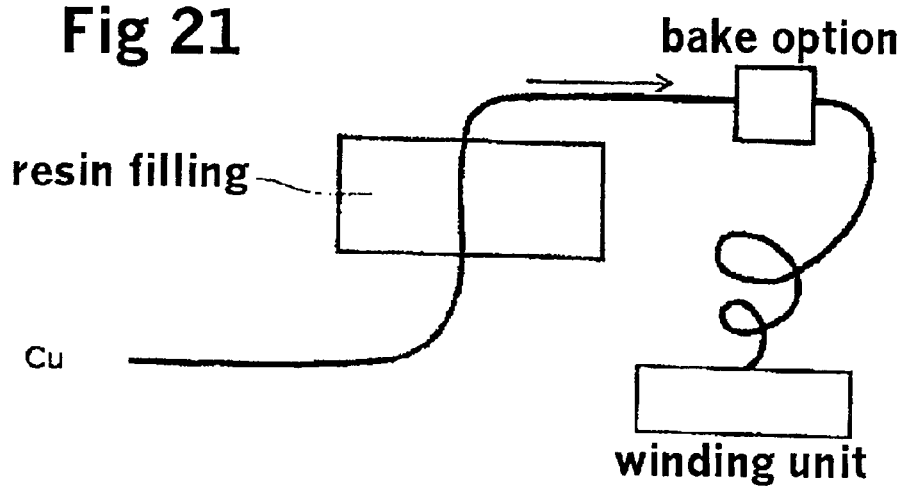
FIG. 21 is a figure for explaining the device for manufacturing the lead wire of the fourteenth embodiment of the present invention.

Referring to FIG. 20, there is shown a cross-sectional diagram of a lead wire of the fourteenth embodiment of the present invention. With a copper wire of a diameter 0.5 mm, resin that has a thickness of 100 $\mu$m and that has dispersed magnetic particles is filled in a device shown in FIG. 21. The lead wire is formed by passing the copper wire through the device at a constant speed. The manufacture method for the magnetic particles is the same as in the second embodiment described above.

Figure 22A:
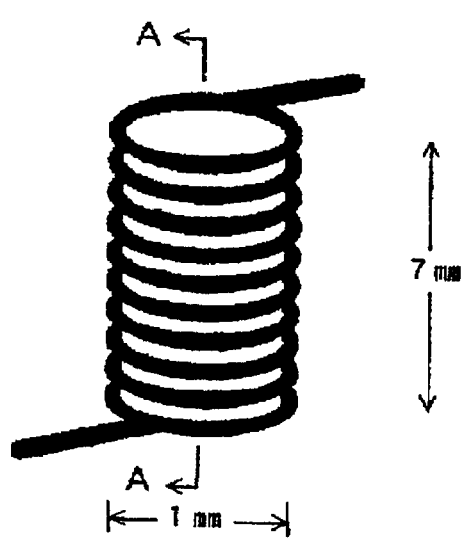
FIG. 22(a) is a sketch drawing of a coil in which the lead wire manufactured in the fourteenth embodiment is wound into a spring shape.
Figure 22B:
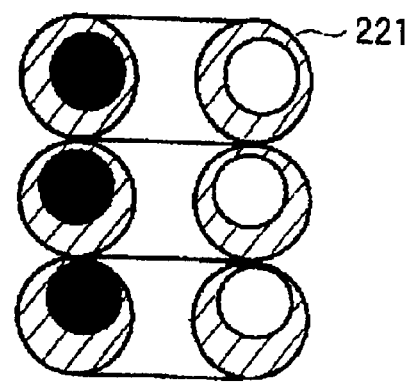
FIG. 22(b) is a partial cross-section along surface A-A'.

Referring to FIG. 22(a), there is shown a sketch diagram of a coil in which the lead wire created in the fourteenth embodiment is wound into a spring-shape. Referring to FIG. 22(b), a partial cross-section along surface A-A' is shown.

Figure 23:
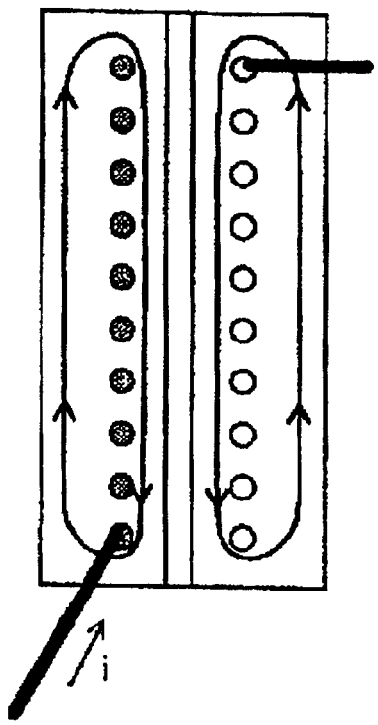
FIG. 23 is a figure for describing the magnetic field generated by the current flowing through the coil of FIG. 22.

Referring to FIG. 22, the filled and unfilled circles are Cu lead wires. An outer circle 221 that surrounds the Cu lead wire shows the portion which is coated with resin. This is a ten turn coil, and it is cylindrical with outer dimensions of a diameter of approximately 1 mm and height of 7 mm. Referring to FIG. 23, there is shown the generated magnetic fields created by the current flowing through the coil in the cross-sectional drawing (FIG. 22b). Referring to FIG. 23, the filled circles show the current flowing into the page, and the unfilled circles show the current flowing out of the page. The magnetic field created by the current flowing through the coil is surrounded by the resin which contains the magnetic particles. The coils are embedded in magnetic fields that are in the direction of the arrows shown in the figure. Because the magnetic flux created by the current flowing through the coil is enclosed in the resin, any mutual electromagnetic interference with an outside element is avoided. In addition, it also has the capability of a small inductor of 10 turns.

Figure 24:
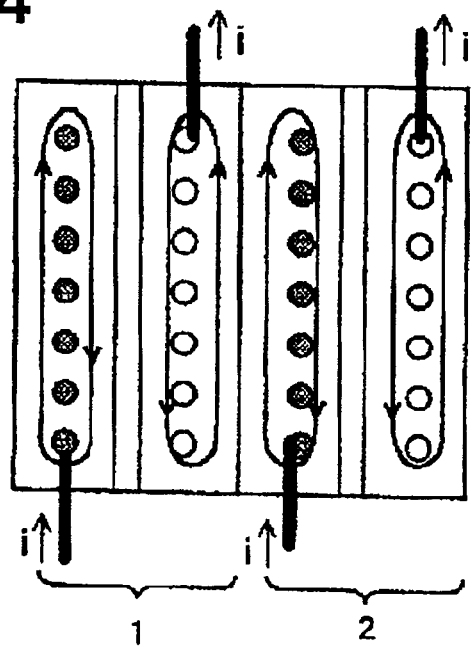
FIG. 24 is a figure for describing the situation when coils are placed in close contact.
Figure 25:
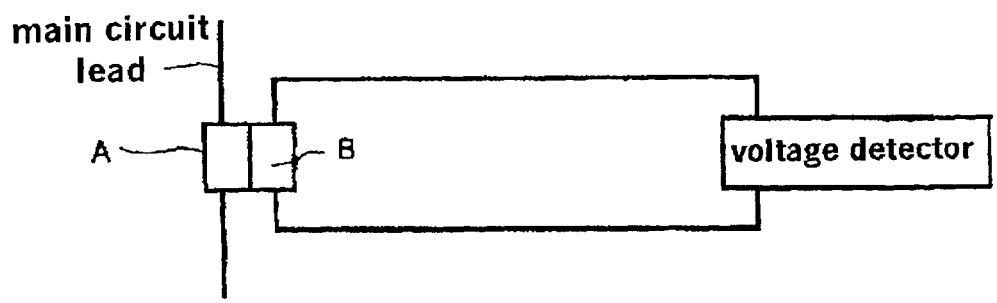
FIG. 25 is a figure for describing an example when the principles in FIG. 24 is applied to a current detection sensor.

On the other hand, referring to FIG. 24, if these elements are placed in close contact and two are laid out side by side, it becomes a transformer with a resin, voltage ratio of 1:1. The voltage ration can be changed by placing coils with different turn numbers in close contact. The magnetic field generated in the primary coil is transferred to the secondary coil via the resin containing magnetic particles. This is the same as the standard transformer in which there is a coil around a magnetic core. The advantage of this invention is that the magnetic core, which is heavy and bulky, is eliminated, and its function is still exhibited. Referring to the figure, the arrows show the direction of the lines of magnetic force. Referring to FIG. 25, there is shown an example where the principles of FIG. 24 is applied to a current detection sensor. The coated lead wire of the present invention is used as the main circuit lead wire. A section (part A) of this main circuit lead wire is coiled as in FIG. 22. Next to section A, there is a coiled wire B (using the lead wire of the present invention) that is a sensor part and is separate from the main circuit. Section A and sensor part B are provided in a unitary manner. As a result, a voltage that is proportional with the size of the current flowing through the main circuit is generated at both ends of sensor part B. By calibrating in advance, the size of the current flowing through the main circuit can be estimated by the voltage generated at both ends of sensor part B. This can be used as a current detection sensor. As described previously, sensor part B can be made very small. As a result, because it can satisfy the demands of being small and light, it can be attached to any section.

As described above, the lead wire of the present invention not only avoids the problem of mutual interference, but at the same time it can also be equipped with a positive and functional role. Stated more concretely, by coating a lead wire with a magnetic material that is electrically insulated, the lead wire also has the functionality of a magnetic component. The advantages of the lead wire of the present invention can be exemplified as follows.

1) Because the electrical resistance is determined by the resin that surrounds the magnetic fine particles, the resistance of the film itself can be a high resistance to the same degree as the resin. An adequate electrical insulation can be ensured. At the same time, because the electric current magnetic field can be enclosed in this coating, any electromagnetic interference with an adjacent lead wire can be prevented.
2) Because the same method as used in the formation of the enamel wires of the prior art can be used, new equipment for implementing the present invention is unnecessary, and manufacture can be conducted cheaply.
3) If the lead wire is a thin wire similar to enamel wire, any shape can be created by coiling or bending and the like. As a result, without having to make a magnetic component by coiling a lead wire around a magnetic core as in the prior art, a magnetic component can be made with just the lead wire. Furthermore, its magnetic qualities are approximately determined by the magnetic particles that are dispersed in resin or are aggregated. As a result, the manufacture of the desired magnetic component can be conducted easily.

Instead of polyimide as the resin, enamel resin, vinyl chloride resin, epoxy resin, and the like can also be used.

Figure 26:
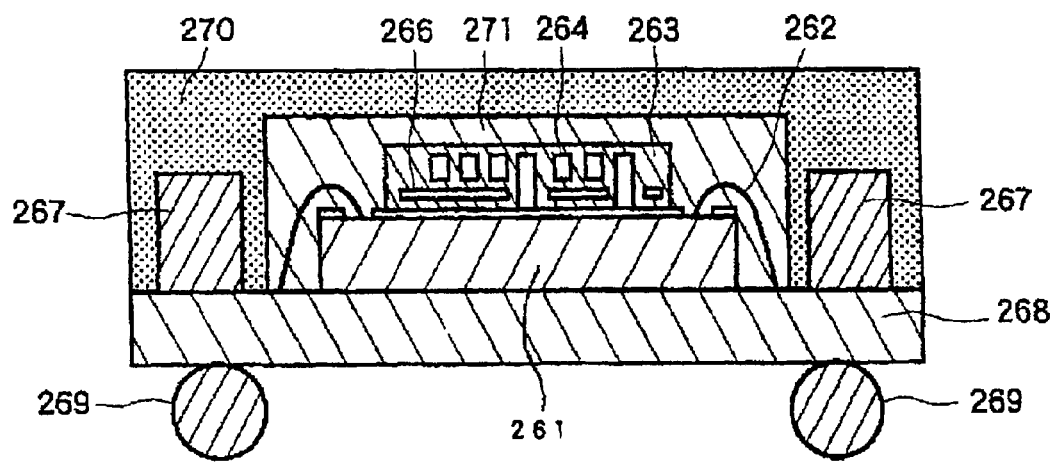
FIG. 26 is a cross-section of a power conversion device of a fifteenth embodiment of the present invention.

Referring to FIG. 26, there is shown a cross-section of a power conversion device of the fifteenth embodiment of the present invention. Referring to FIG. 26, there is a semiconductor integrated circuit substrate 261, a metal thin wire 262, a polyimide insulation film 263, a coil conductor (Cu) 264, a lower magnetic film 266, a chip condenser 267, a printed board 268, a soldering ball 269, and a sealing resin 271 containing magnetic particles. The magnetic particles are prepared in the same manner as in Embodiment 2 described previously.

Stated more concretely, coil conductor 264 (a planar coil) is formed by the standard method on top of semiconductor integrated circuit substrate 261 via polyimide insulation film 263 and is formed up to the top part of polyimide insulating film 263. Next, this is cut out as a chip by dicing. While this is mounted on top of the printed board and without using silica which is normally used as a skeleton material, this is sealed by a mold resin with a one-sided transfer mold used in BGA and the like. This mold resin contains 75–85% of magnetic powder of Embodiment 2 described previously, or magnetic powder or ferrite powder of particle size of approximately 0.1–120 $\mu$m. Sealing resin 271 containing magnetic particles is formed in this manner. Afterwards, other individual components are mounted on top of the printed board, and the entirety is sealed with sealing resin 270 of the prior art.

The magnetic particles of the prior art have a thermal expansion coefficient of approximately 3 times that of silica. As a result, the stress applied to the silicon substrate is increased, and there is a negative impact on reliability and quality. There is the possibility of generating equipment that does not satisfy specifications. However, if a mold resin containing the magnetic thin film of the present invention at 25–30% dispersion is used, the stress applied to the silicon substrate can be reduced.

Figure 27:
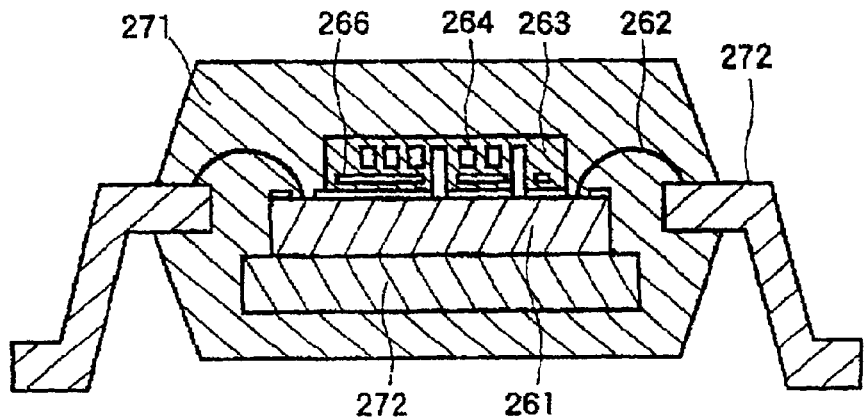
FIG. 27 is a cross-section of a power conversion device of a sixteenth embodiment of the present invention.

Referring to FIG. 27, there is shown a cross-sectional diagram of a power conversion device of the sixteenth embodiment of the present invention. Referring to FIG. 26, the numerals are the same as in FIG. 26, and therefore, the descriptions are omitted. In the sixteenth embodiment, in the same manner as the fifteenth embodiment, a planar coil is formed to the top part of polyimide insulation film 263. After cutting out the chip by dicing, this is affixed and connected to a lead frame 272, and this is connected to the inner leads by metal thin wires 262. Afterwards, without using silica which is normally used as a skeleton material, this is sealed by a transfer mold using a mold resin. This mold resin contains 75–85% of metal magnetic powder or ferrite powder of approximate particle size of 0.1–120 $\mu$m. This is made into a mold package of DIP, QFP, QFN, and the like.

According to the fifteenth and sixteenth embodiments, the accumulation and etching process of the upper magnetic thin film becomes unnecessary. Complexity in the manufacture process can be avoided. Furthermore, stress due to the shrinking of the magnetic thin film arising from heat treatment can also be prevented. In addition, the magnetic particles can also act as the skeleton material for the sealing resin. Furthermore, because an upper magnetic thin film is not formed, the warping of the substrate due to its shrinkage can be reduced. The generated stress with a construction of the prior art is $5.8 \times 10^6$ (dyn/cm). With a silicon substrate of phi 6 inches (thickness 625 $\mu$m), this results in a warping of approximately 1200 $\mu$m. With the fifteenth embodiment, the warping of the silicon substrate can be reduced to ⅔ of the prior art. Furthermore, because the inductor side surfaces are covered with a magnetic thin film, the leakage magnetic flux can be reduced.

Furthermore, with the present invention, for the resin in which the aforementioned magnetic particles are dispersed, it is preferred to select an organic magnetic polymer that is magnetic in order to have a large magnetic interaction between the magnetic particles and ultimately to increase the magnetic quality of the entire film. By doing so, even if the density of magnetic particles in the resin is low compared to polymers that are not magnetic, the magnetic interactions between magnetic particles are strengthened via the polymer. A magnetic particle dispersion resin having the desired magnetic quality is achieved.

When the material powder for the magnetic particles is a magnetic oxide, even if there is contact with an adjacent conductor, an electrical short does not result, and this is preferred.

Stated more concretely, in the present invention, examples of the preferred organic magnetic polymer include cross conjugated polycarbene or a conjugated polymer having a main chain of polyacetylene and polydiacetylene.

A cross conjugated polycarbene can be obtained in the following manner.

A precursor diazo compound shown in the following general formula is synthesized.

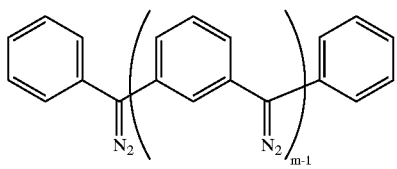

Next, UV light is shone on this precursor. By conducting a photolysis reaction, the following cross conjugated polycarbene can be obtained.

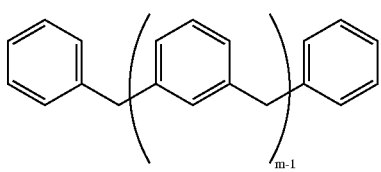

In the formula, the dot represents a radical electron having a spin of an open-shell structure. This is a result of the dissociation of the $N_2$ in chemical formula 1 by a photochemical reaction. This is the source of the magnetism of this resin. Furthermore, m can be selected as desired from 10 through on the order of $10^2$. For example, it can be selected to be 30 or less.

Using this cross conjugated polycarbene, a magnetic thin film as shown in the previously described second embodiment is created. This resulted in a structure in which magnetic particles of 20 nm are surrounded by an approximately 100 nm thick polycarbene, and these are arranged approximately uniformly. Furthermore, in the above, a cross conjugated polycarbene is used, but a poly (p-oxyphenyl acetylene) shown below can also be used. A polydiacetylene compound can also be used.

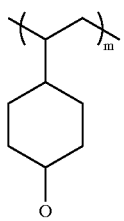

For the polymerization of the substituted acetylene, a catalyst such as an olefin metathesis catalyst (for example $WCl_6$-$SnPh_4$) and Rh (I) catalyst of Furlani et al can be used.

The method of usage for the aforementioned magnetic organic polymer is not particularly limited. For example, a magnetic component can be made by the standard methods.

Referring to Table 5, there are shown the qualities of the thin film inductor with a magnetic film of the prior art, the thin film inductor with a magnetic film of the present invention in which Fe fine particles are dispersed in polyimide resin, the thin film inductor with a magnetic film of the present invention in which Fe fine particles are dispersed in cross conjugated polycarbene resin, the thin film inductor with a magnetic film of the present invention in which Fe fine particles are dispersed in poly (p-oxyphenyl acetylene) resin which is described below. As is clear from comparing these tables, compared to the prior art, thin film inductors with magnetic films in which Fe fine particles are dispersed have excellent quality in terms of inductance and loss. However, compared to when the resin is non-magnetic such as polyimide, the inductance is higher when a magnetic resin such as polycarbene and the like is used. This can be understood to be the result of a strengthened magnetic bonding (interaction) between Fe fine particles.

TABLE 5

| Qualities of the thin film inductor of the prior art (4 mm square, 16 turn) | |
|---|---|
| Operating conditions | Frequency 3 MHz, driving current 0.35A |
| Inductance value L (microH) | 0.95 |
| Direct current resistance Rdc (ohm) | 0.8 |
| Alternating current resistance Rac (ohm) | 5.38 |

Qualities of the thin film inductor when the resin is polyimide(4 mm square,16 turn)

| Operating conditions | Frequency 3 MHz, driving current 0.35A |
|---|---|
| Inductance value L (microH) | 1.15 |
| Direct current resistance Rdc (ohm) | 0.8 |
| Alternating current resistance Rac (ohm) | 2.35 |

Qualities of the thin film inductor when the resin is polycarbene(4 mm square,16 turn)

| Operating conditions | Frequency 3 MHz, driving current 0.35A |
|---|---|
| Inductance value L (microH) | 2.12 |
| Direct current resistance Rdc (ohm) | 0.8 |
| Alternating current resistance Rac (ohm) | 2.35 |

Qualities of the thin film inductor when the resin is poly (p-oxyphenyl acetylene) (4 mm square, 16 turn)

| Operating conditions | Frequency 3 MHz, driving current 0.35A |
|---|---|
| Inductance value L (microH) | 1.62 |
| Direct current resistance Rdc (ohm) | 0.8 |
| Alternating current resistance Rac (ohm) | 2.35 |

The present invention provides a magnetic thin film that is well suited for mass production, can be manufactured easily, can be made into a thick film, and has soft magnetic qualities. The present invention also provides a magnetic component that uses this thin film, and manufacturing methods for these, and a power conversion device.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A manufacturing method for a magnetic thin film, comprising:
   a process for dispersing magnetic fine particles surrounded by a non-metal film in a medium;
   a process for coating said medium on top of an insulating film;
   a process for heat treating and solidifying said medium.

2. A manufacturing method for a magnetic thin film as described in claim 1, wherein:
   said medium is a non-photosensitive resin solution or a photosensitive resin solution.

3. A manufacturing method for a magnetic thin film, comprising:
   a process for dispersing magnetic fine particles surrounded by a non-metal film in a medium;
   a process for coating said medium on top of an insulating film;
   a process for heat treating, evaporating, and removing said medium.

4. A manufacturing method for a magnetic thin film as described in claim 3, wherein:
   said medium is toluene.

5. A manufacturing method for a magnetic component, comprising:
   a first magnetic thin film and a second magnetic thin film being magnetic thin films comprising a resin having magnetic fine particles dispersed therein;
   a process for forming said first magnetic thin film on top of a semiconductor substrate via an insulating film;
   a process for forming a thin film conductor in a spiral shape on top of said first magnetic thin film;
   a process for filling a second resin in spaces in said spiral thin film conductor; a process for forming said second magnetic thin film on top of said thin film conductor and said second resin.

6. A manufacturing method for a magnetic component as described in claim 5, wherein:
   said second resin is a magnetic thin film comprising a resin having magnetic fine particles dispersed therein.

7. A manufacturing method for a magnetic component as described in claim 5, further comprising:
   a third magnetic thin film and a fourth magnetic thin film being magnetic thin films constructed from magnetic fine particles, and said fine particles are aggregated so that said fine particles are in contact with each other;
   a process for forming said third magnetic thin film on top of a semiconductor substrate via an insulating film;
   a process for forming a spiral-shaped thin film conductor on top of said third magnetic thin film;
   a process for forming said third magnetic thin film in spaces in said spiral-shaped thin film conductor;
   a process for forming said fourth magnetic thin film on top of said thin film conductor and said third thin film.

* * * * *